United States Patent
Ren et al.

(10) Patent No.: US 11,610,843 B2
(45) Date of Patent: Mar. 21, 2023

(54) WELL TAP FOR AN INTEGRATED CIRCUIT PRODUCT AND METHODS OF FORMING SUCH A WELL TAP

(71) Applicant: GLOBALFOUNDRIES U.S. Inc., Santa Clara, CA (US)

(72) Inventors: Hongru Ren, Mechanicville, NY (US); David Pritchard, Glenville, NY (US); Ryan W. Sporer, Mechanicville, NY (US); Manjunatha Prabhu, Clifton Park, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 0 days.

(21) Appl. No.: 17/194,565

(22) Filed: Mar. 8, 2021

(65) Prior Publication Data

US 2022/0285274 A1 Sep. 8, 2022

(51) Int. Cl.
*H01L 23/535* (2006.01)
*H01L 21/74* (2006.01)
*H01L 27/12* (2006.01)

(52) U.S. Cl.
CPC .......... *H01L 23/535* (2013.01); *H01L 21/743* (2013.01); *H01L 27/1203* (2013.01)

(58) Field of Classification Search
CPC . H01L 23/535; H01L 21/743; H01L 27/1203; H01L 29/78612; H01L 21/26506
USPC .......................................... 257/348; 438/282
See application file for complete search history.

(56) References Cited

U.S. PATENT DOCUMENTS

| 5,962,895 A | 10/1999 | Beyer et al. |
| 6,677,190 B1 | 1/2004 | Houston |
| 2008/0116514 A1* | 5/2008 | Zhu et al. ......... H01L 21/26506 438/233 |
| 2015/0179734 A1* | 6/2015 | Guowei et al. .... H01K 29/0649 438/420 |
| 2020/0127013 A1 | 4/2020 | Pritchard et al. |

OTHER PUBLICATIONS

Kotani et al., "Suppression of Leakage Current in SOI CMOS LSIs by Using Silicon-Sidewall Body-Contact (SSBC) Technology," 2002 Symposium on VLSI Technology Digest of Technical Papers, pp. 44-45, 2002 IEEE.

* cited by examiner

*Primary Examiner* — Thinh T Nguyen
(74) *Attorney, Agent, or Firm* — Hoffman Warnick LLC

(57) ABSTRACT

An illustrative device disclosed herein includes a doped well region and a conductive well tap conductively coupled to the doped well region, the conductive well tap including first and second opposing sidewall surfaces. In this example the device also includes a first sidewall spacer that has a first vertical height positioned around the conductive well tap and a second sidewall spacer positioned adjacent the first sidewall spacer along the first and second opposing sidewall surfaces of the conductive well tap, wherein the second sidewall spacer has a second vertical height that is less than the first vertical height.

13 Claims, 28 Drawing Sheets

WELL TAP FOR AN INTEGRATED CIRCUIT PRODUCT AND METHODS OF FORMING SUCH A WELL TAP

FIELD OF THE INVENTION

The present disclosure generally relates to the fabrication of integrated circuits, and, more particularly, to various embodiments of a well tap for an integrated circuit (IC) product and various methods of forming such a well tap.

BACKGROUND

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NFET or PFET type devices wherein the "N" and "P" designation is based upon the nature of the charge carriers (electrons for NFET devices, holes for PFET devices) and type (N or P) of dopants used to create the source/drain regions of the devices. So-called CMOS (Complementary Metal Oxide Semiconductor) technology or products refers to integrated circuit products that are manufactured using both NFET and PFET transistor devices.

As performance requirements have increased, the transistors may be formed in and above an SOI (semiconductor-on-insulator) substrate that includes a base semiconductor substrate, a buried insulation layer (sometime referred to as a "BOX" layer when the buried insulation layer comprises silicon dioxide) positioned on the base substrate and an active layer comprised of a semiconducting material positioned on the buried insulation layer. Moreover, such transistors may be formed as fully-depleted (FDSOI) devices wherein the active layer of the SOI substrate, i.e., the channel region of the transistors, is substantially free of dopant materials.

In many applications, doped well regions are formed in some portion of the semiconductor substrate for various reasons. For example, one technique employed in CMOS circuits to dynamically adjust the threshold voltage of the transistors in the CMOS circuit involves body-biasing, i.e., applying a voltage to a doped well region in the substrate. Formation of a conductive contact (e.g., a well tap) that is conductively coupled to the doped well region can be problematic in some cases. For example, depending upon its configuration, formation of the well tap can lead to significant variation in the topology of the product which presents processing challenges. In other cases, the well tap may occupy a relatively large amount of the valuable plot space on an IC product.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various embodiments of a well tap for an IC product and various methods of forming such a well tap. An illustrative device disclosed herein includes a doped well region and a well tap that is coupled to the doped well region, wherein the well tap comprises first and second opposing sidewall surfaces. In this example the device also includes a first sidewall spacer that has a first vertical height positioned around the well tap and a second sidewall spacer positioned adjacent the first sidewall spacer along the first and second opposing sidewall surfaces of the well tap, wherein the second sidewall spacer has a second vertical height that is less than the first vertical height.

Another illustrative device disclosed herein includes a doped well region that is at least partially positioned in a base semiconductor layer of an SOI substrate and a well tap that extend through a buried insulation layer of the SOI substrate and is coupled to the doped well region, wherein the well tap comprises an outer perimeter. In this example, the device also includes a first sidewall spacer that is position around the entire outer perimeter of the well tap.

An illustrative method of forming a device disclosed herein includes forming a first gate structure adjacent a second gate structure and forming an opening extending through at least a portion of the first gate structure, through an active layer of the device, and through a buried oxide layer to a bulk semiconductor layer of the device. Additionally, the illustrative method can include forming a doped well region in the bulk semiconductor layer of the device at the bottom of the opening, and forming a well tap by depositing a conductor in the opening to contact the bulk semiconductor layer and substantially filling the opening with the conductor.

BRIEF DESCRIPTION OF THE DRAWINGS

The disclosure may be understood by reference to the following description taken in conjunction with the accompanying drawings, in which like reference numerals identify like elements, and in which.

Figure 1:
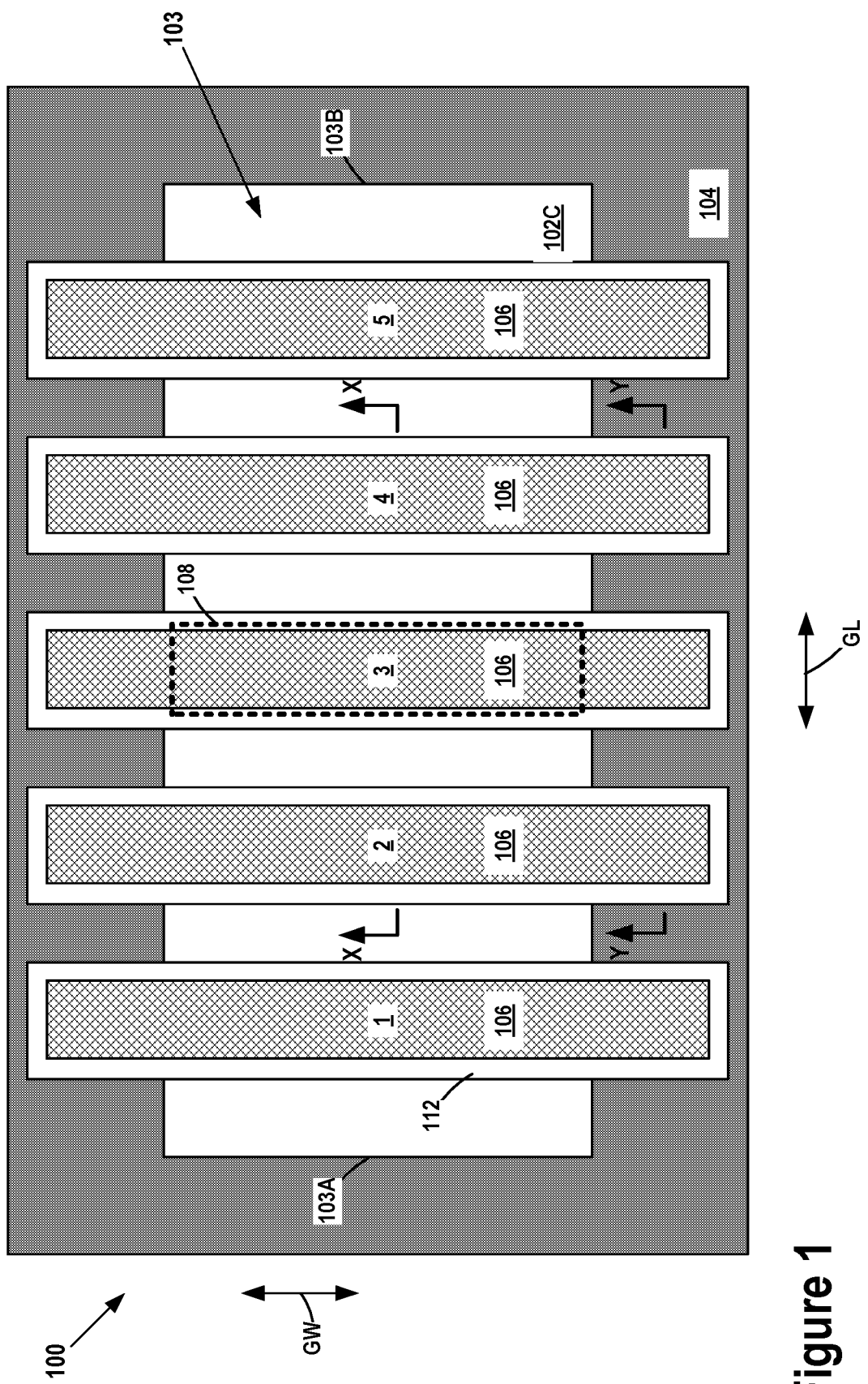
FIGS. 1-28 depict various embodiments of a well tap for an IC product and various methods of forming such a well tap. The drawings are not to scale.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be appreciated by those skilled in the art after a complete reading of the present application, the various devices and methods may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, nanowire devices, etc. In the illustrative examples depicted herein, the transistor devices will be planar devices. The gate structures for the transistor devices may be formed using either "gate first" or "replacement gate" manufacturing techniques. Thus, the presently disclosed inventions should not be considered to be limited to any particular form of transistors or the manner in which the gate structures of the transistor devices are formed. Of course, the illustrative embodiments of the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. The thicknesses of these various layers of material may also vary depending upon the particular application. Moreover, as used herein and in the attached claims, the word "adjacent" is to be given a broad interpretation and should be interpreted to cover situations where one feature actually contacts another feature or is in close proximity to that other feature.

FIGS. 1-28 depict various embodiments of a well tap 150 for an IC product 100 and various methods of forming such a well tap 150. In the examples depicted herein, the IC product 100 will be formed in and above a semiconductor substrate 102. See FIG. 2. The substrate 102 may have a variety of configurations, such as a silicon-on-insulator (SOI) or silicon-germanium-on-insulator (SGOI) configuration that includes a base semiconductor layer 102A, a buried insulation layer 102B positioned on the base semiconductor layer 102A and an active semiconductor layer 102C positioned on the buried insulation layer 102B. Alternatively, the substrate 102 may have a simple bulk configuration. The substrate 102 may be made of silicon or it may be made of materials other than silicon. Thus, the terms "substrate" or "semiconductor substrate" should be understood to cover all semiconducting materials and all forms of such materials.

FIG. 1 is a simplistic plan view of one illustrative embodiment of an IC product 100 that may be formed using the methods described herein. The product 100 generally comprises a plurality of gate structures 106 (each respectively designated 1-5 for ease of reference) for various transistor devices that are formed in and above a semiconductor substrate 102. The gate length (GL) direction and the gate width (GW) direction of the transistor devices are also depicted in FIG. 1. In the illustrative example depicted herein, the transistor devices are planar devices, but the inventions disclosed herein should not be considered to be limited to IC products that include planar transistor devices, as the methods disclosed herein may be used to form a well tap on a variety of different types of IC products 100 that include transistors having any of a variety of different configurations (e.g., fin-type transistors, vertically-oriented transistors, and/or other structures). Also depicted in FIG. 1 is an active area 103 (defined in the active semiconductor layer 102C) surrounded by an STI region 104 that is comprised of an insulating material, e.g., silicon dioxide. The STI region 104 was formed by performing known manufacturing techniques.

Various cross-sectional views of the IC product 100 (views "X-X" and "Y-Y") in the attached drawings are taken where indicated in FIG. 1. More specifically, the cross-sectional view X-X is taken through three of the gate structures 106 (gates 2-4) at a location above the active region 103 in the gate length direction of the transistor devices. The cross-sectional view Y-Y is taken through three of the gate structures 106 (gates 2-4) in the gate length direction of the transistor devices at a location above the STI region 104. As will be described more fully below, in the example depicted herein, gate contact structures (not shown) that will conductively contact the gate structures 106 will be formed at a location that is vertically above the STI region 104. Of course, in other embodiments, gate contact structures may be formed at a location that is vertically above the active region 103. The various plan views included in the drawings do not contain all of the components and/or the layers of material depicted in the cross-sectional views so as not to overly complicate the drawings. Also shown in FIG. 1 is a dashed line region 108 where one illustrative embodiment of a well tap 150 disclosed herein, shown in various implementations in FIGS. 20, 22-26, and 28, will be formed between the spacer 112 and above at least a portion of the active region 103 using the methods described below. In other embodiments, the well tap 150 disclosed herein may be positioned above an entirety of the active region 103 and portions of the well tap 150 may be positioned above of the STI region 104, i.e., the well tap 150 may have a length (in the gate width direction of the transistor devices) that is substantially equal to the length (in the gate width direction of the transistor devices) of the gate structure 106 of gate 3.

Figure 2:
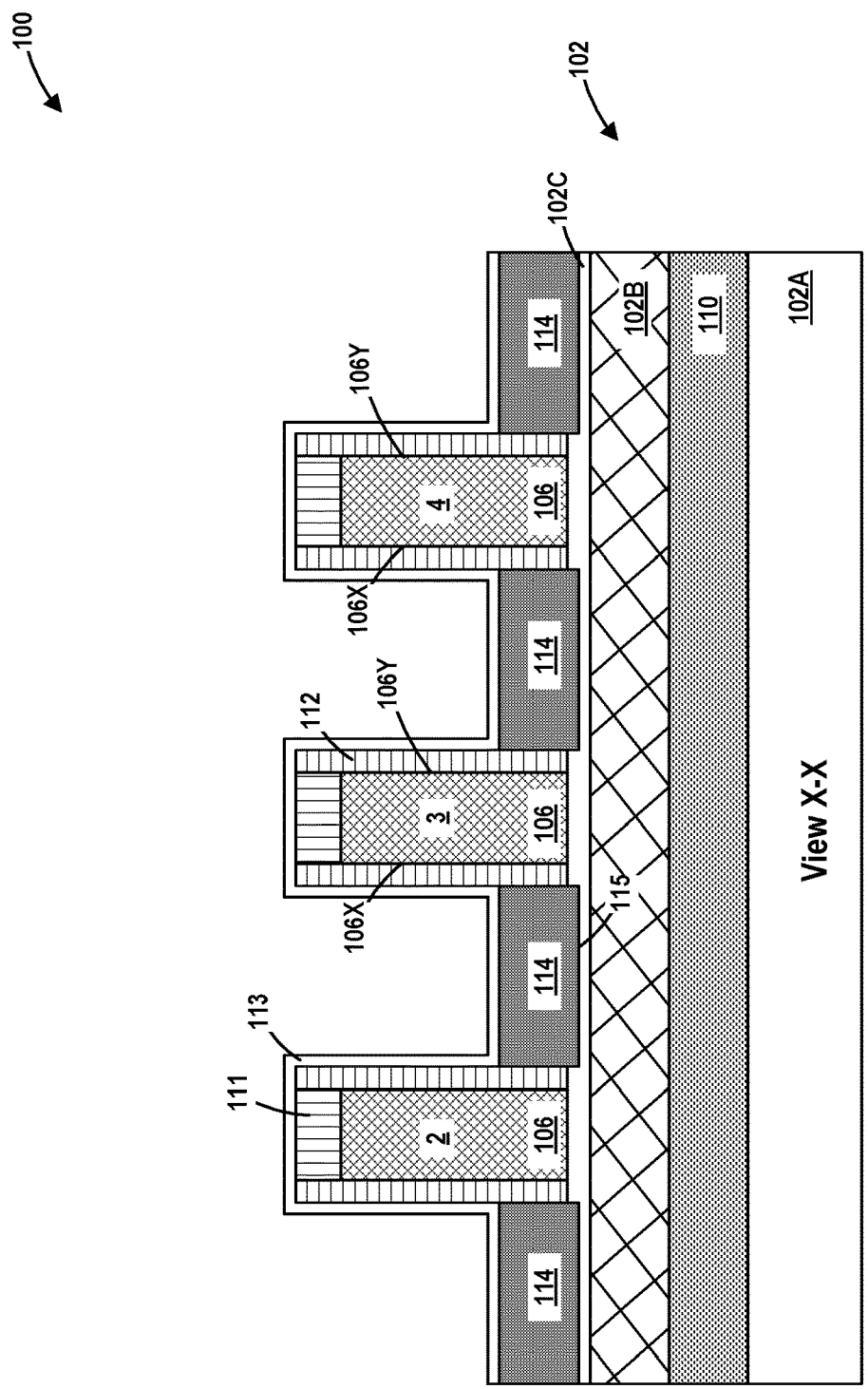

FIG. 2 (view X-X) depicts the IC product 100 in an intermediate form as can be obtained by performing several process operations. First, an ion implantation process can be performed to form a doped well region 110 in the base semiconductor layer 102A below the buried insulation layer 102B. In the depicted example, the doped well region 110 can extend under the entirety of the active region 103 defined in the active layer 102C by the STI region 104. The doped well region 110 may be doped with any desired N or P type dopant material, the concentration of dopant atoms within the doped well region 110 and the vertical thickness of the doped well region 110 may vary depending upon the particular application. The doped well region 110 may be formed by performing known masking and doping techniques (e.g., ion implantation). The purpose or use of the doped well region 110 may vary depending upon the particular application. In one illustrative embodiment, the doped well region 110 may be used to back-bias the transistors (not shown) that will be formed above the active region 103. Thereafter, the STI region 104 (e.g., silicon dioxide) can be formed by performing traditional etching, deposition and CMP processing operations. Forming the STI region 104 will involve removal of at least the active semiconductor layer 102C. In one illustrative embodiment, the bottom of the STI region 104 may be located in the base semiconductor layer 102A.

Still referring to FIGS. 1 and 2, further processing can involve the formation of the gate structures 106 and the gate caps 111. In the particular process flow described herein, the gate structures 106 can be formed by performing known gate-first manufacturing techniques. However, as noted above, the well tap 150 disclosed herein may be formed on an IC product 100 where the gate structures 106 are manufactured using known replacement gate manufacturing techniques. Each of the gate structures 106 can include at least a gate insulation layer (not separately shown, e.g., silicon dioxide, a high-k material, etc.) and a conductive gate electrode (not separately shown, e.g., polysilicon, a metal, etc.). Each of the gate structures comprises opposing lateral sidewalls 106X, 106Y. In one illustrative example, the materials for the gate structures 106 and the gate caps 111 can be deposited across the substrate 102. At that point, the materials for the gate structure 106 (at least the material for the conductive gate electrode) and the gate caps 111 may be patterned by performing known masking and etching techniques to form the gate structures 106 and the gate caps 111. The gate caps 111 may comprise a variety of different materials, e.g., silicon nitride.

Still referring to FIG. 2, a simplistically-depicted sidewall spacer 112 may be formed adjacent each of the gate structures 106. The sidewall spacer 112 may be formed by performing a conformal deposition process to form a conformal layer of spacer material, e.g., silicon nitride, silicon dioxide, a low-k material, SiCON, SiCO, SiBCN, etc., and thereafter performing an anisotropic etching process. The spacer 112 may be of any desired thickness at its base. In some applications, multiple spacers and/or spacer material may be formed adjacent the gate structures 106.

Still referring to FIG. 2, an etching process can be used to form a recess 115 in the active layer 102C between the spacers 112 on adjacent gate structures 106. The recesses 115 may not be formed in all applications. Next, epitaxial semiconductor material 114 was formed on the exposed portions of the active region 103, i.e., in the source/drain regions of the devices, by performing an epitaxial growth process. The epitaxial semiconductor material 114 may be formed to any desired thickness. However, it should be understood that the epitaxial semiconductor material 114 need not be formed in all applications. The epitaxial semiconductor material 114 may be made of a variety different materials, e.g., SiGe, Si, SiC, etc., and it may be doped in situ or it may be doped by performing known ion implantation techniques. Next, a conformal contact etch stop layer 113 was formed on the product 100 by performing a conformal deposition process. The contact etch stop layer 113 may be formed to any desired thickness and it may be formed from a variety of different materials, e.g., silicon nitride.

Figure 3:
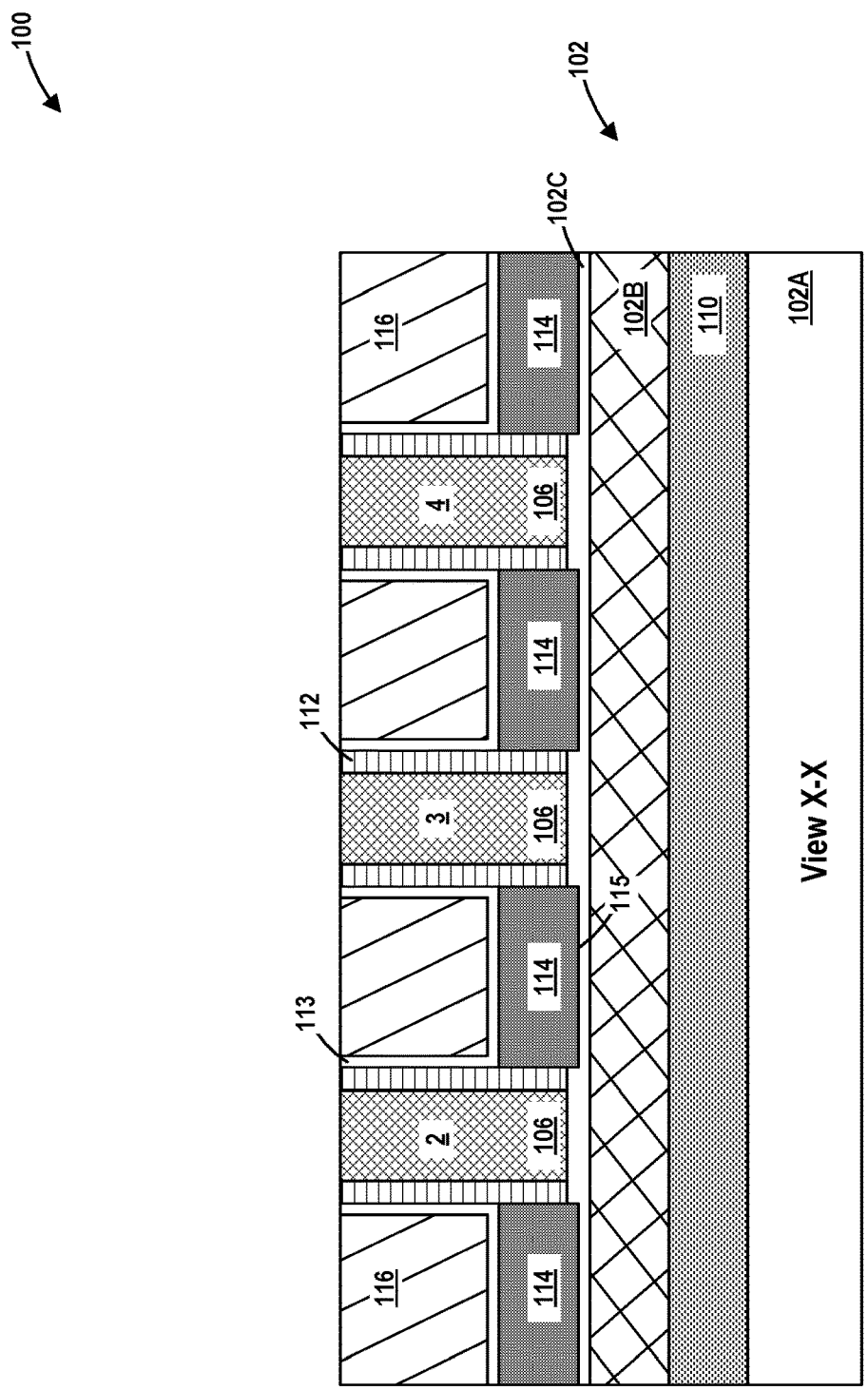

FIG. 3 (view X-X) depicts the IC product 100 in a further intermediate form as it undergoes further processing. For instance, a layer of insulating material 116 (e.g., silicon dioxide, a low-k material, etc.) may be blanket-deposited across the substrate 102. Thereafter, a chemical mechanical polishing (CMP) process planarizes the layer of insulating material 116 and to remove the gate caps 111 positioned above the gate structures 106. This process operation exposes the upper surface of the gate structures 106.

Figure 4:
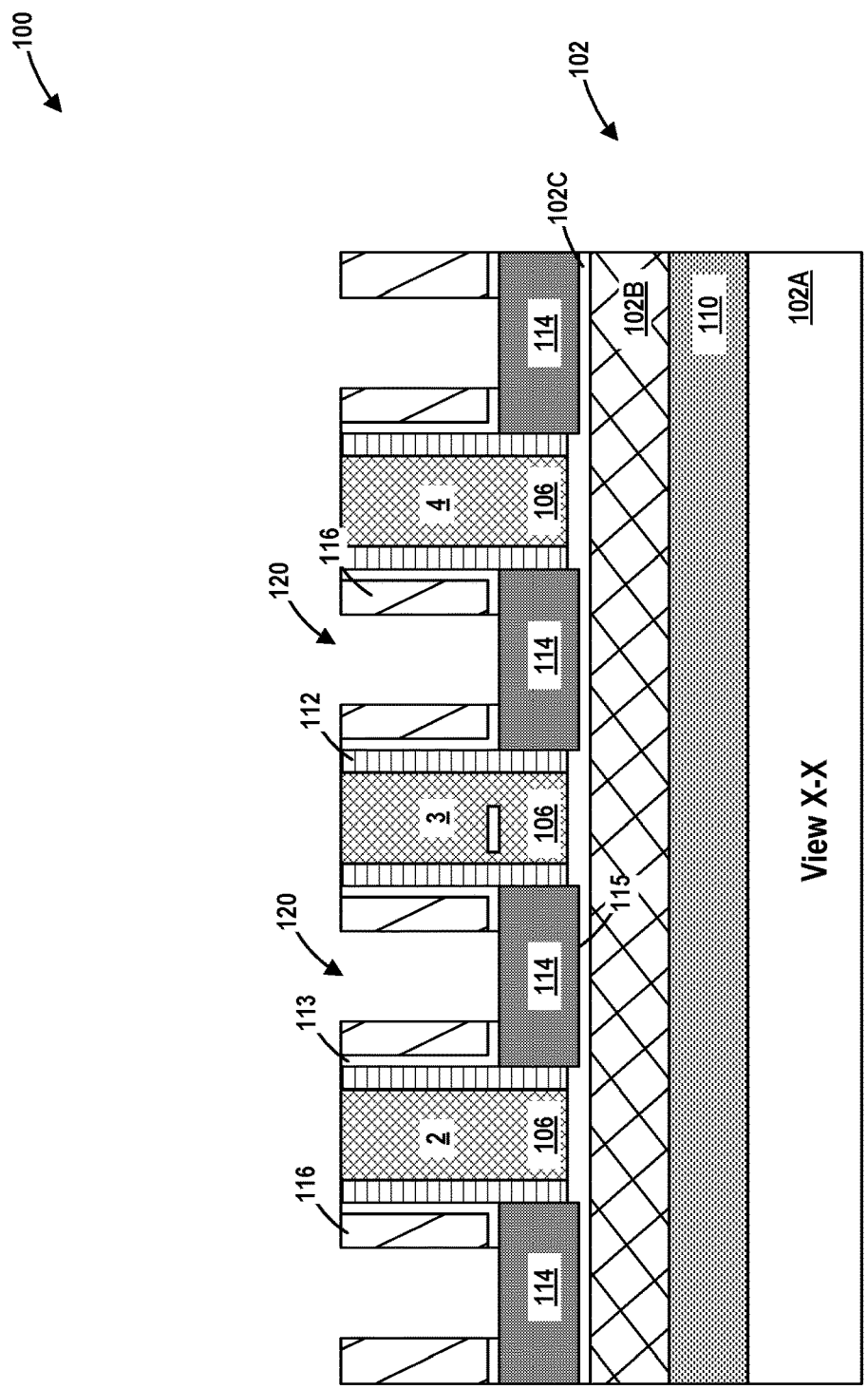

FIG. 4 (view X-X) depicts a still further intermediate form of IC product 100 reflecting additional performance of additional process operations. For example, a first patterned etch mask (not shown), e.g., a patterned OPL layer, can be formed on the product 100. The first patterned etch mask can include a plurality of openings at locations above the epitaxial semiconductor material 114. One or more etching process may be performed on product 100. The etching process(es) can remove portions of the layer of insulating material 116 and portions of the contact etch stop layer 113 and results in the formation of a plurality of contact openings 120. The contact openings 120 can be located above the epitaxial semiconductor material 114 in the source/drain regions of the transistor devices, and they expose portions of the underlying epitaxial semiconductor material 114. Thereafter, the first patterned etch mask can be removed.

Figure 5:
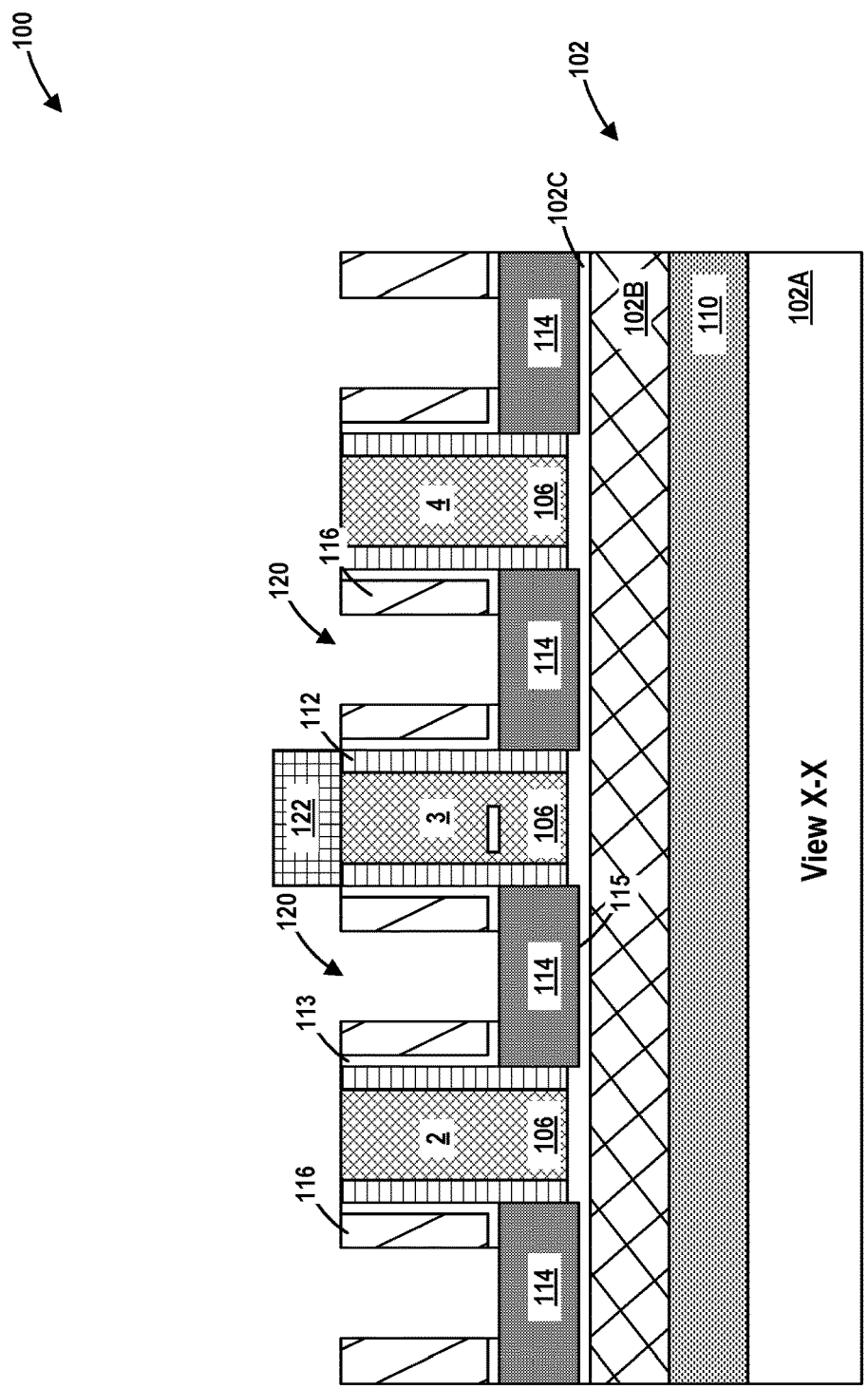
Figure 6:
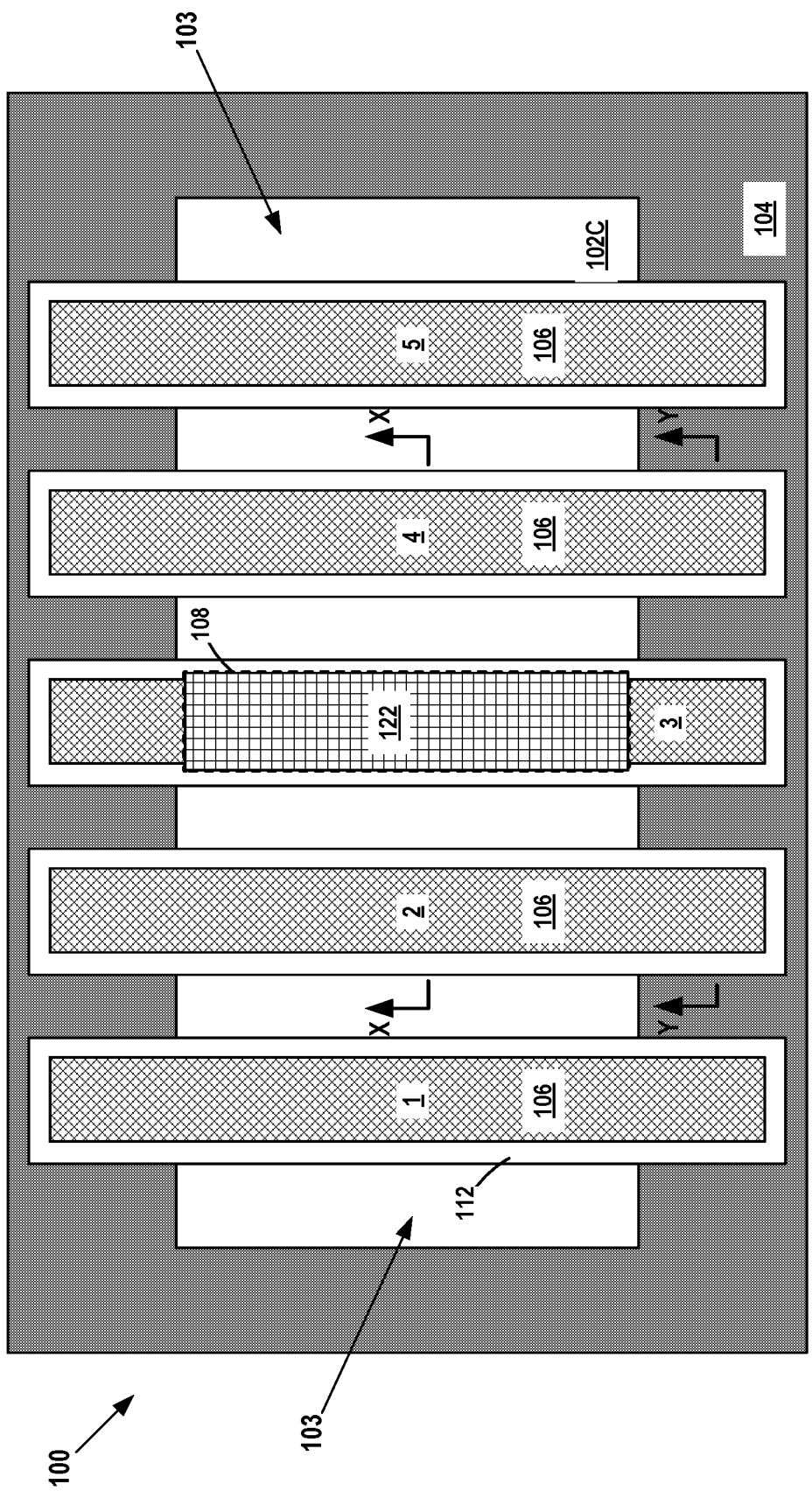

FIGS. 5 (view X-X) and 6 (plan view) depict forming a patterned masking layer 122 above gate structure 106 of gate 3. The patterned masking layer 122 may be a patterned hard mask layer, e.g., a patterned layer of silicon nitride, since it will be exposed to processes performed to form regions of metal silicide material, as described more fully below. The patterned masking layer 122 may be formed by performing known deposition, masking and etching processes. In the illustrative example depicted here, the patterned mask layer 122 may cover substantially the entire portion of the gate structure 106 that is positioned above the active region 103. However, as will be appreciated by those skilled in the art after a complete reading of the present application, in other situations the patterned masking layer 122 may cover only a portion of the gate structure 106 that is positioned above the active region 103. In even other applications, the patterned mask layer 122 may cover substantially the entire length (in the gate width direction) of the gate structure 106 of gate 3.

Figure 7:
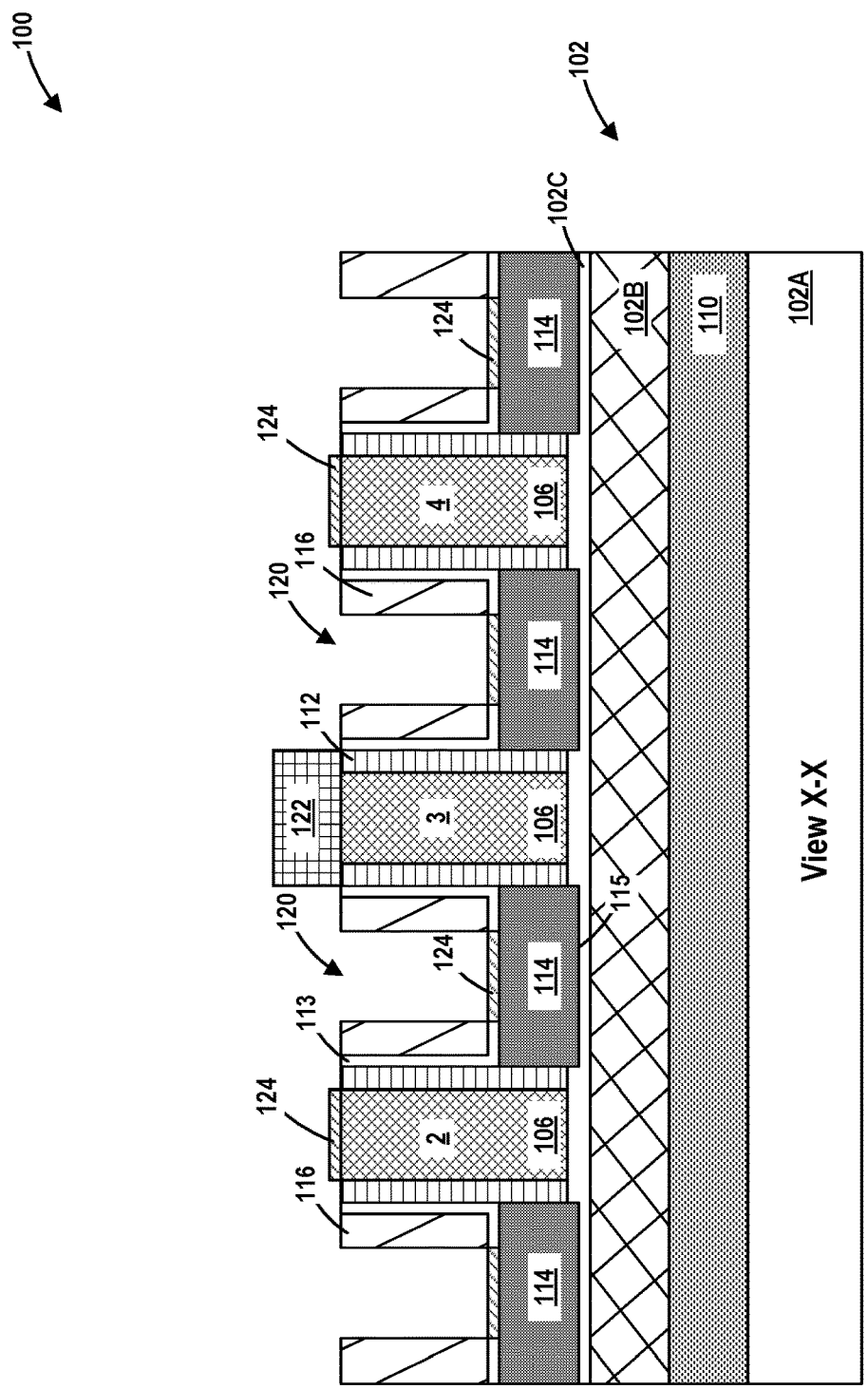
Figure 8:
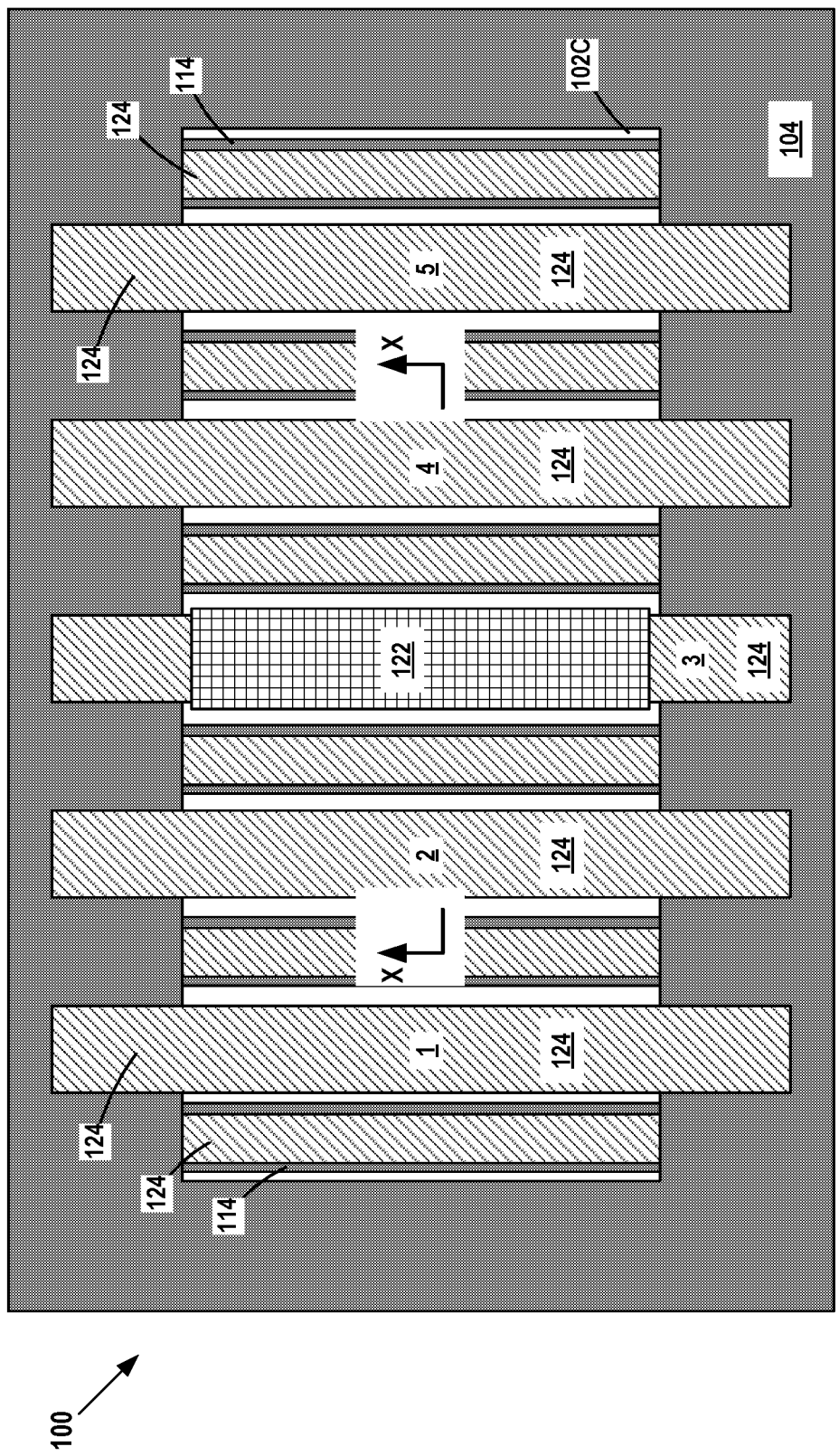

FIGS. 7 (view X-X) and 8 (plan view) depict forming regions of metal silicide material 124 on the exposed portions of all of the gate structures 106 and on the exposed portions of the epitaxial semiconductor material 114. The sidewall spacers 112 are not depicted in FIG. 8 so as not to overly complicate the drawings. The metal silicide material 124 may be manufactured by performing known metal silicidation process operations, e.g., deposition of a metal material, heating of the metal material and removal of unreacted portions of the metal material. The metal silicide material 124 may be formed to any desired thickness, and it may be any of a variety of different metal silicide materials, e.g., nickel silicide, platinum silicide, etc. Note that the patterned masking layer 122 prevents the formation of any metal silicide 124 on the covered portion of the gate structure 106 of gate 3. FIGS. 7 and 8 depict the illustrative situation where the gate structures 106 comprise polysilicon or amorphous silicon and thus the metal silicide material 124 forms on the exposed portions of the gate structure 106 that are comprised of polysilicon or amorphous silicon as well as on the exposed portions of the epitaxial semiconductor 124. In the illustrative case where the gate structure 106 comprises a metal or metal-alloy as the gate electrode, a separate masking layer (not shown) may be provided to protect the metal-containing gate materials during the silicidation process.

Figure 9:
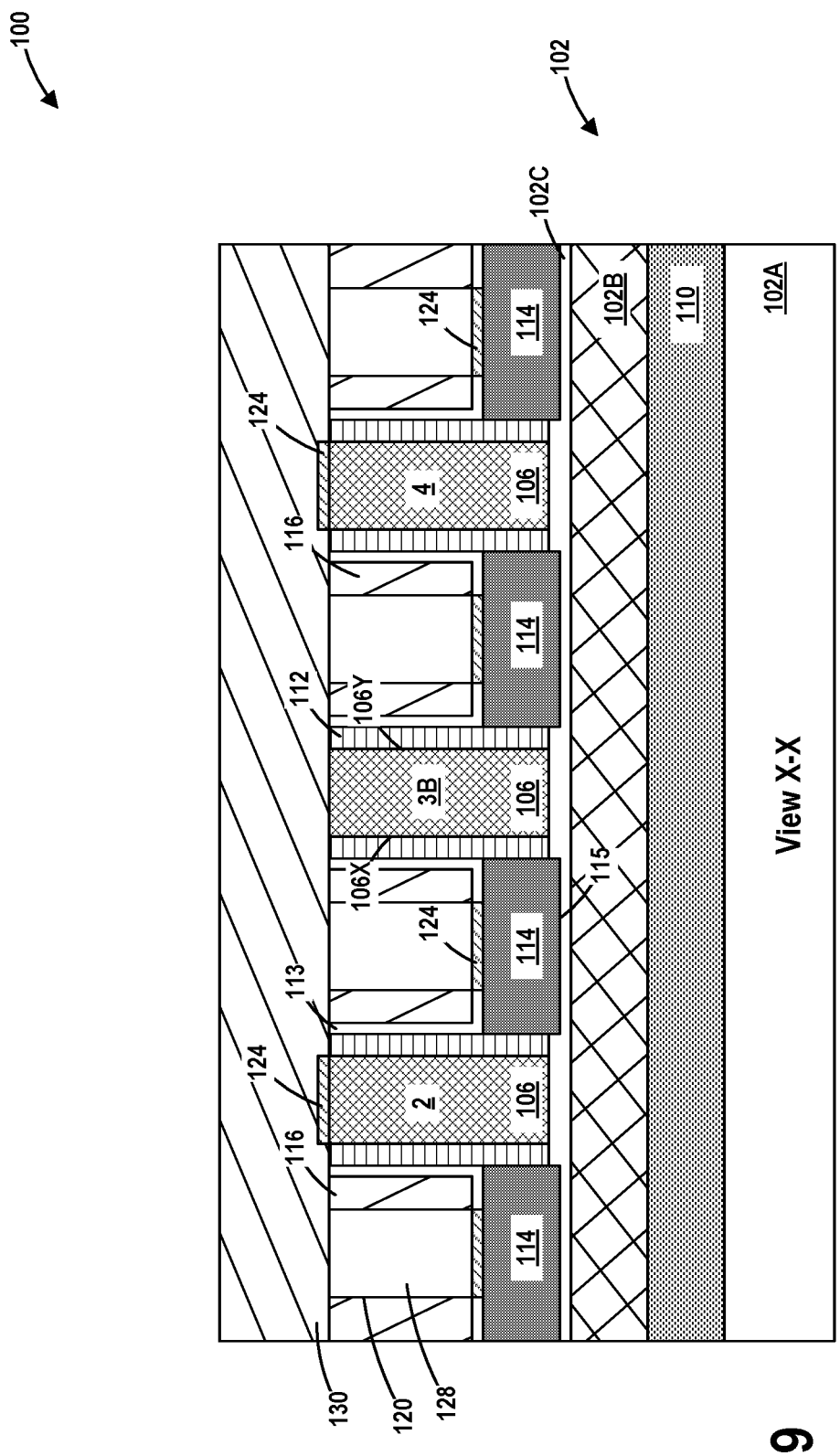

FIG. 9 (view X-X) depicts the IC product 100 after several further process operations. First, the patterned masking layer 122 can be removed. Thereafter, if desired, an optional conformal stress liner (not shown) may be formed on the product 100, in the openings 120 and above the metal silicide materials 124. Next, a layer of insulating material 128 can be formed on the IC product 100 to fill the openings 120 that exposed the epitaxial semiconductor material 114. Thereafter, a planarization process can be implemented on the layer of insulating material 128 to remove excess amounts of the insulating material 128 positioned outside of the openings 120. The layer of insulating material 128 may be comprised of a variety of different materials, e.g., silicon dioxide, a low-k material, etc. Then a representative one or more layers of insulating material 130 was deposited on the IC product 100. The layer of insulating material 130 is representative in nature is that it may represent a single layer of material or multiple layers of material. If desired, a planarization process may be performed on the uppermost surface of the layer(s) of insulating material 130 to substantially planarize its upper surface. The single or multiple layers of insulating material 130 may be comprised of a variety of different insulating materials, e.g., silicon nitride, silicon dioxide, a low-k material, etc., and its overall vertical thickness may vary depending upon the particular application.

Figure 10:
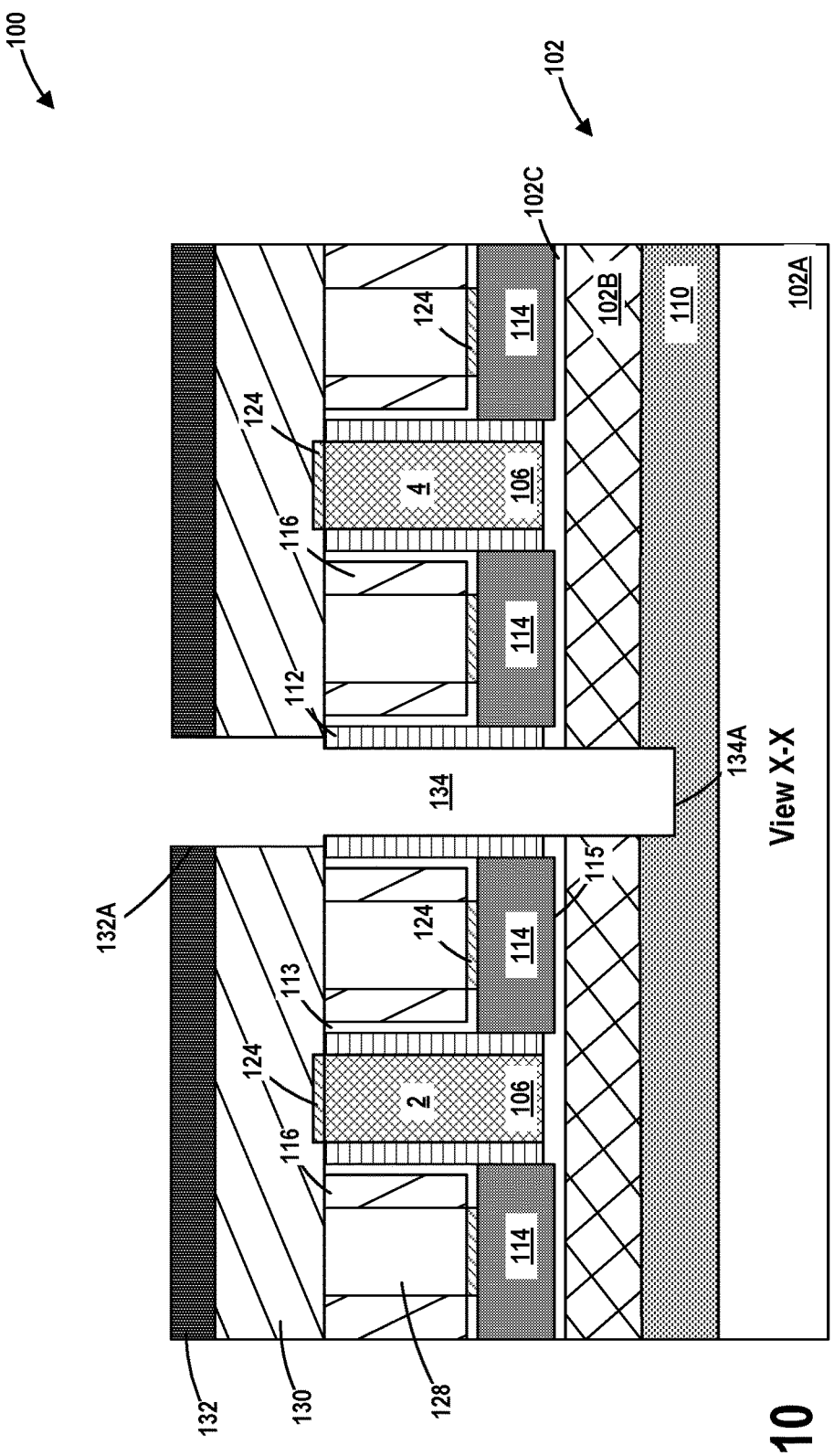
Figure 11:
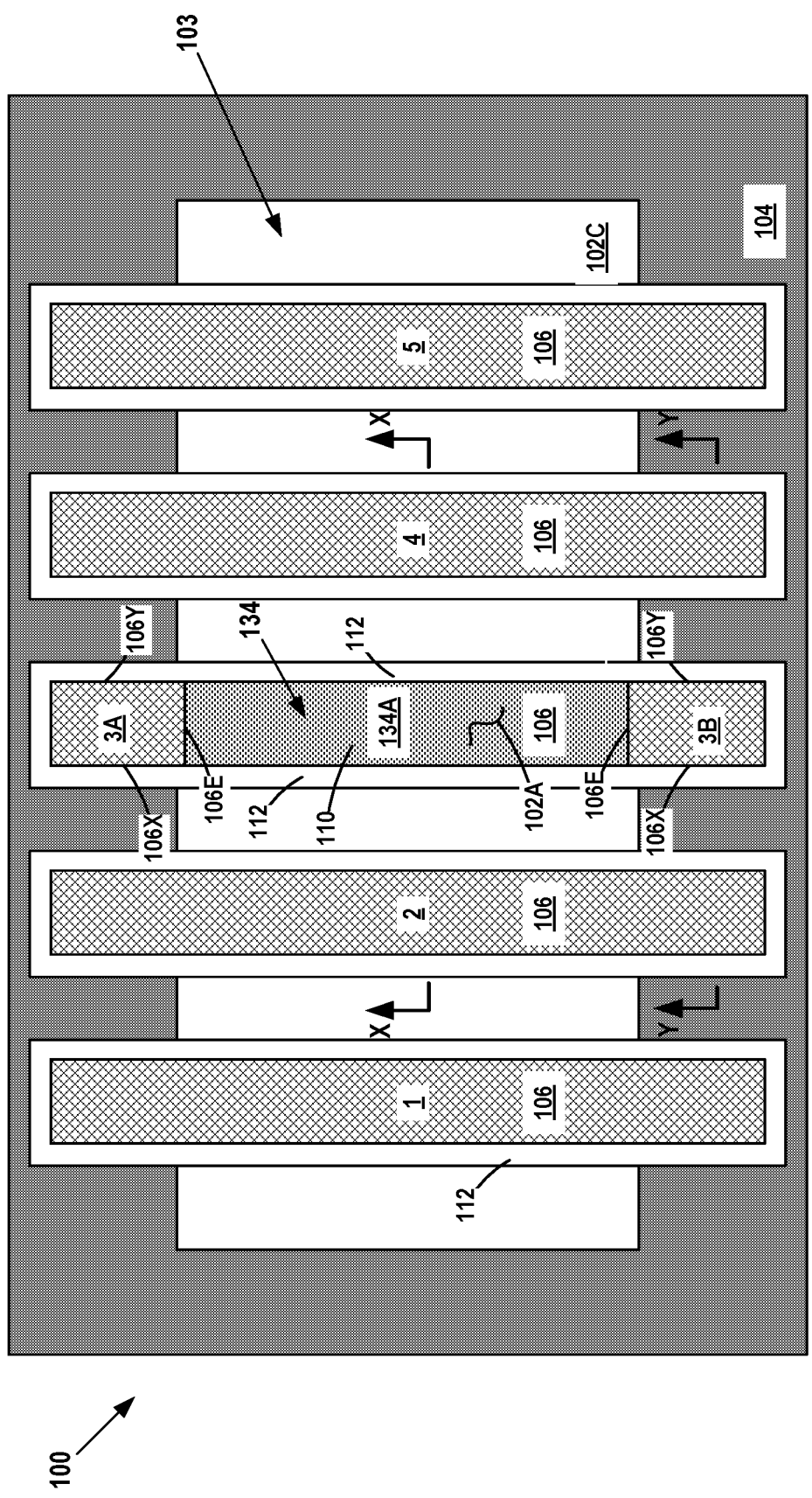

FIGS. 10 (view X-X) and 11 (plan view) depict several additional process operations. First, a second patterned etch mask 132, e.g., a patterned layer of photoresist, can be formed on the product 100. The second patterned etch mask 132, the metal silicide material 124, the epi semiconductor material 114 and various layers of insulating material are not depicted in FIG. 11 so as not to overly complicate the drawing. The second patterned etch mask 132 comprises an opening 132A at a location above the portion of the gate structure 106 of gate 3 that is free of the metal silicide material 124. Then, one or more etching process was performed on the IC product 100 to form a well contact opening 134 with a bottom surface 134A that extends to the doped well region 110 in the base semiconductor layer 102A. In some applications, the well contact opening 134 may only expose the upper surface of the doped well region 110, e.g., the upper surface of the base semiconductor layer 102A. With reference to FIG. 11, note that, in this illustrative process flow, the etching process operation cuts the gate structure 106 of gate 3, i.e., the gate electrode and the gate insulation layer, into two gates 3A and 3B, each of which have their own gate structure 106 (comprising at least a gate electrode and a gate insulation layer), wherein each of the two gate structures 106 comprise an end surface 106E.

As will be appreciated by those skilled in the art after a complete reading of the present application, the gate structures 106 of the gates 3A and 3B may be active gates or "dummy" gates with respect other devices or components formed on the IC product 100 and the axial lengths (in the gate width direction of the transistor devices) of the gates 3A and 3B may be formed with an initial length such that the gate structures 106 of the gates 3A, 3B extend over other active regions (not shown) formed on the IC product 100. In the depicted example, in the gate length direction of the transistor devices, a portion of the sidewall spacer 112 positioned on gate 3 partially bounds the well contact opening 134 while, in the gate width direction of the transistor devices, the gate structures 106 of the gates 3A and 3B partially bounds the well contact opening 134. In the vertical direction, the well contact opening 134 is partially bounded by the base semiconductor layer 102A, e.g., the bottom surface 134A. With reference to FIG. 11, note that the sidewall spacer 112 remains positioned adjacent the opposing lateral sidewalls 106X, 106Y of the gate structures 106 of the gates 3A, 3B.

Figure 12:
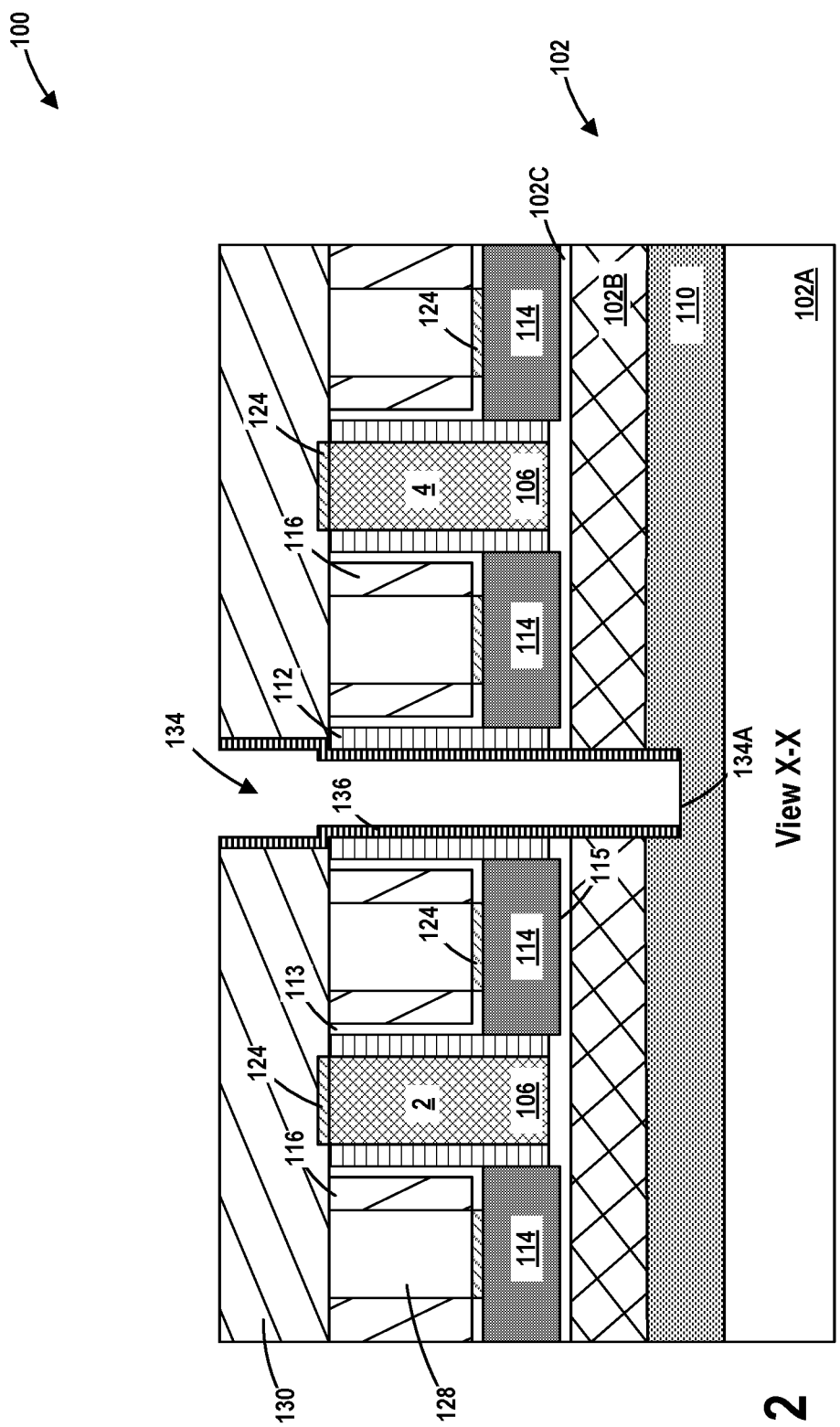
Figure 13:
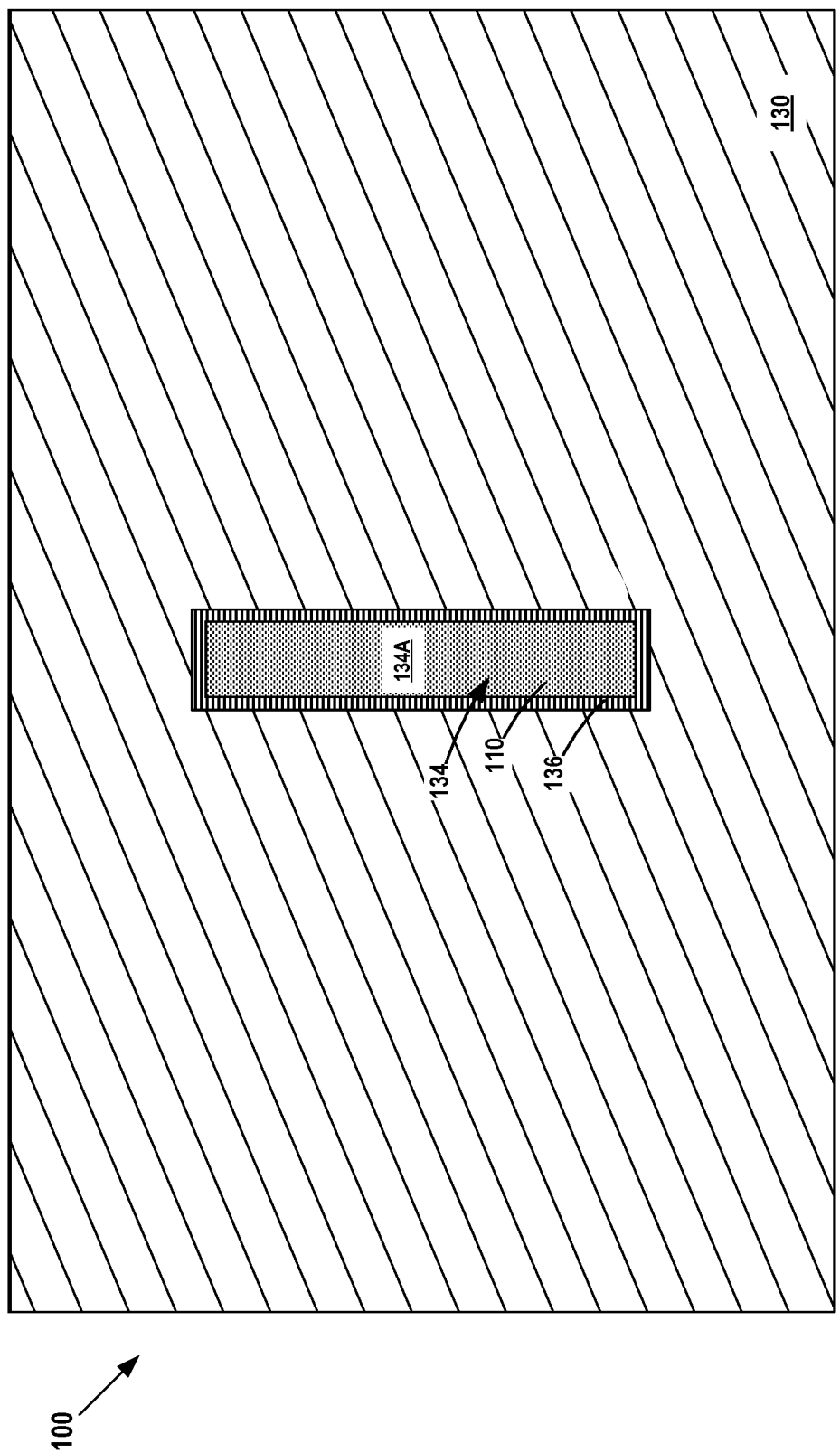

FIGS. 12 (view X-X) and 13 (plan view) depict several further process operations. First, the second patterned etch mask 132 was removed. Next, a simplistically-depicted internal sidewall spacer 136 was formed in the well contact opening 134. The internal sidewall spacer 136 may be formed by performing a conformal deposition process to form a conformal layer of spacer material, e.g., silicon nitride, silicon dioxide, a low-k material, SiCON, SiCO, SiBCN, etc., and thereafter performing an anisotropic etching process. The internal sidewall spacer 136 may be of any desired thickness at its base. In some applications, multiple internal spacers may be formed in the well contact opening 134.

Figure 14:
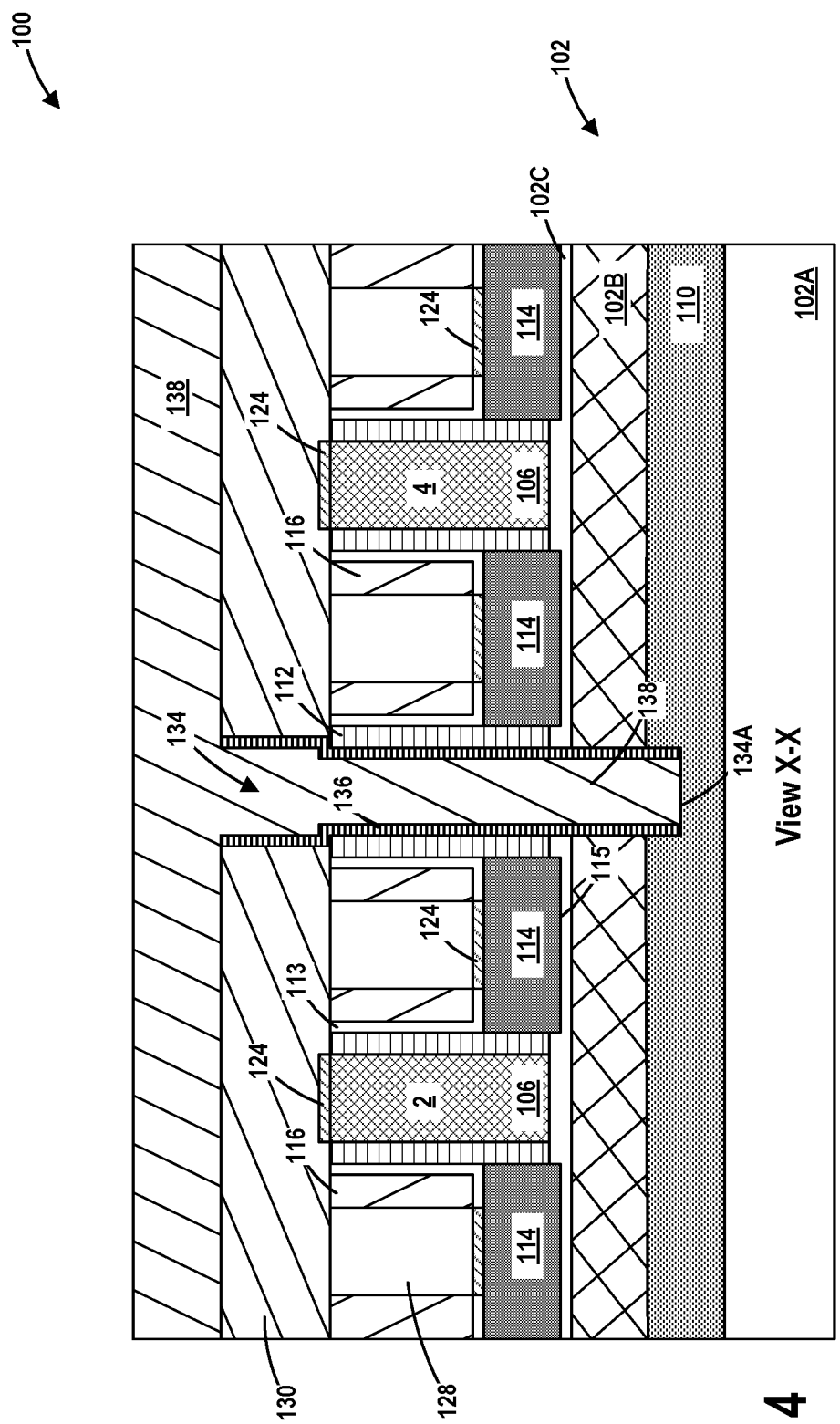
Figure 15:
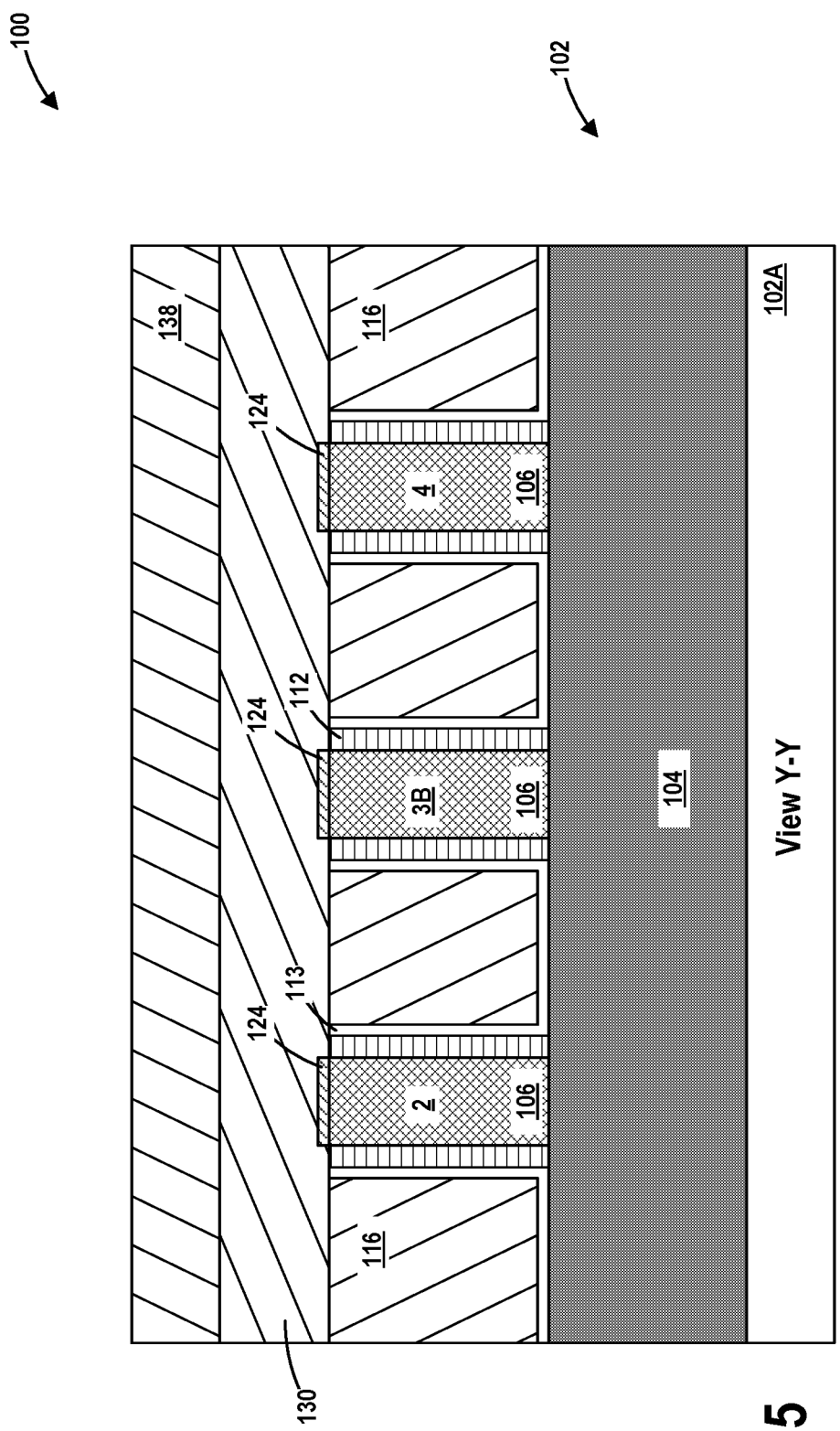

FIGS. 14 (view X-X) and 15 (view Y-Y) depict the IC product 100 after a layer of sacrificial material 138, e.g., OPL, SOH, etc., was formed on the IC product 100 and in the well contact opening 134 so as to overfill the well contact opening 134. The layer of sacrificial material 138 may be formed to any desired thickness above the upper surface of the layer(s) of insulating material 130.

The next series of process steps will lead to the formation of a plurality of conductive source/drain contact structures 146 (see FIG. 20), a plurality of conductive gate contact structures 148 (see FIG. 21) and the conductive well tap 150 (see FIG. 20) in the well contact opening 134. These conductive structures may be comprised of a conductor including a variety of different conductive material, e.g., tungsten, copper, cobalt, nickel, etc. and they also may comprise one or more barrier layers or liner liners (which are not separately shown in the figures), e.g., TiN, etc. As will be appreciated by those skilled in the art, the contact openings 142 (see FIG. 16) for the source/drain contact structures 146 may be formed prior to the contact openings 144 (see FIG. 19) for the gate contact structures 148, or vice-versa. In other applications the contact openings 142, 144 may be formed at the same time. In the illustrative example depicted herein, the contact openings 142, 144 will be depicted as being formed at two different times. In one illustrative process flow, the layer of sacrificial material 138 may serve as a patterned etch mask to form the contact openings 142 and/or the contact openings 144. In the case where the contact openings 142, 144 are formed at the same time using a single patterned etch mask, the contact opening 137 may be formed at the same time as the contact openings 142, 144. In some cases, two separate patterned etch masks may be formed—one to form the contact openings 142 and another to form the contact openings 144, but that may not be the case in all applications. In the dual patterned mask situation, the contact opening 137 may be formed using either mask. In the illustrative example depicted herein, the contact openings 142 for the source/drain contact structures 146 will be formed prior to forming the contact openings 144 for the gate contact structures 148. The contact opening 137 above the well contact opening 134 will be formed at the same time as the contact openings 142 for the source/drain contact structures 146 are formed.

Figure 16:
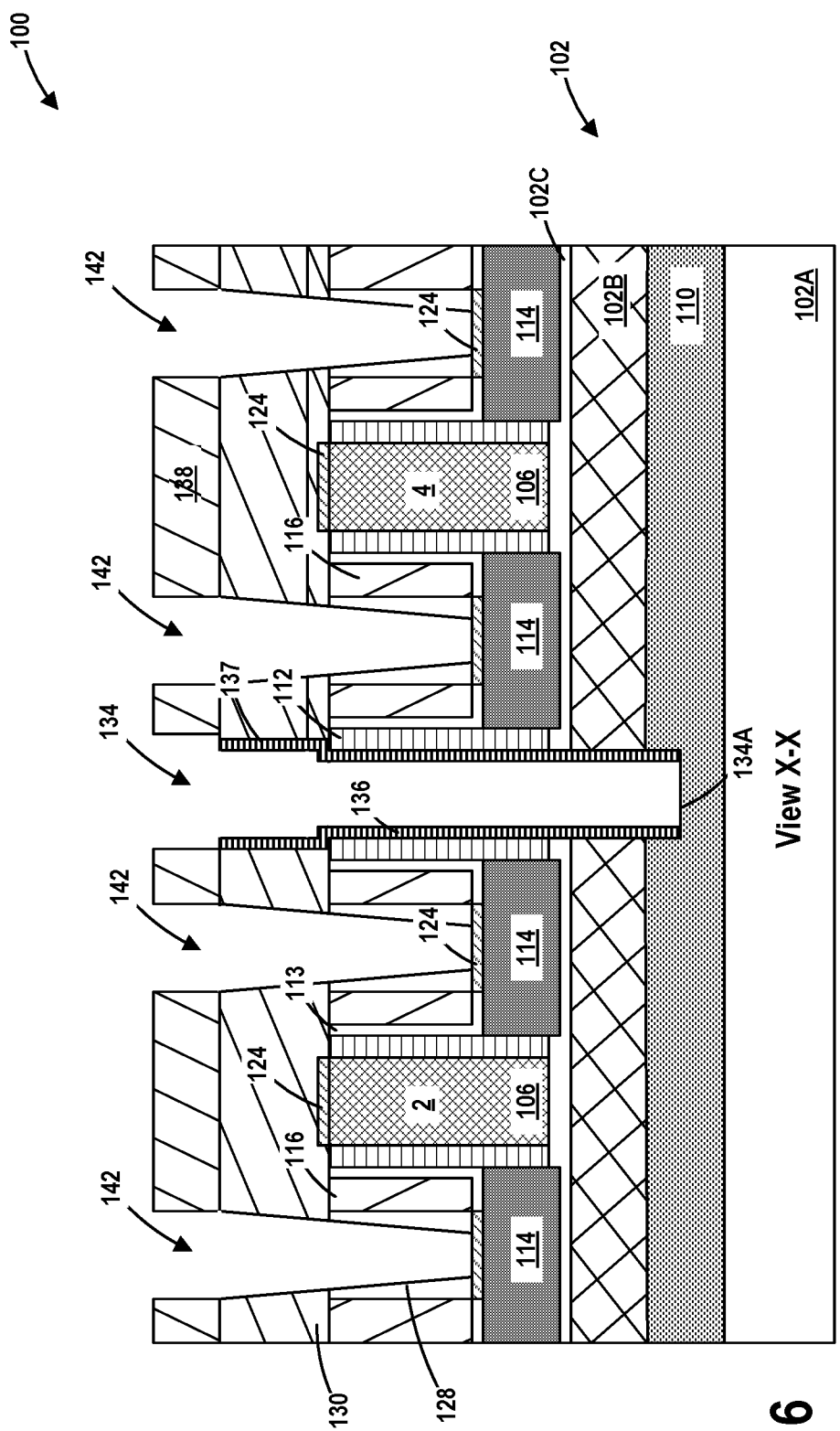
Figure 17:
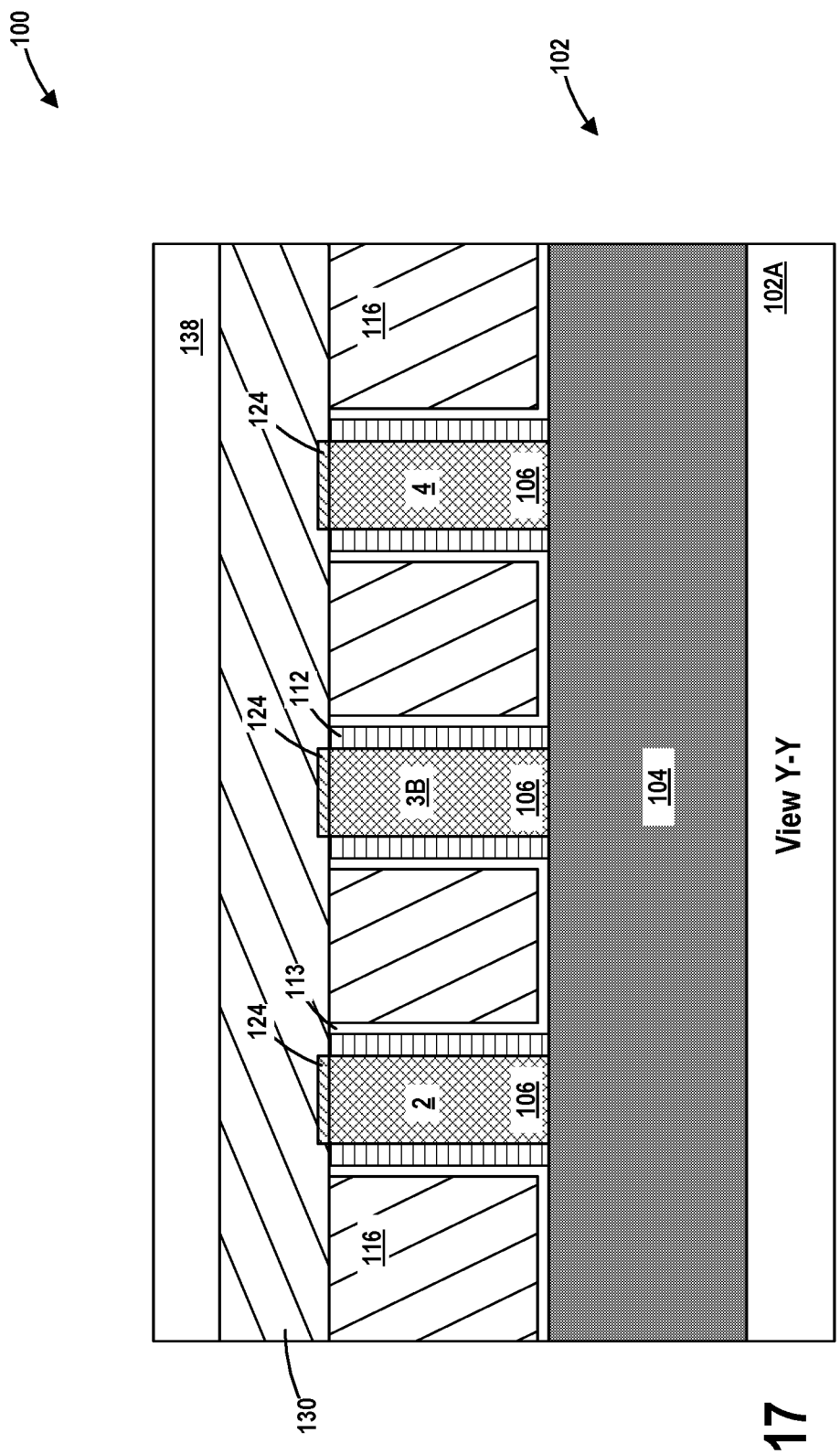

FIGS. 16 (view X-X) and 17 (view Y-Y) depict further processing operations. For instance, the layer of sacrificial material 138 may be patterned using traditional patterning techniques. The patterned layer of sacrificial material 138 includes a plurality of openings that corresponds to locations where the contact openings 142 for the source/drain contact structures 146 will be formed. The patterned layer of sacrificial material 138 also includes an opening where the contact opening 137 above the well contact opening 134 will be formed. The patterned layer of sacrificial material 138 covers the location where the gate contact structures 148 will be formed (see FIGS. 17, 19, and 21). Then, one or more etching processes was performed through the patterned layer of sacrificial material 138 to form the openings 142 and the contact opening 137 in the layer(s) of insulating material 130. At the conclusion of the etching process(es), portions of the metal silicide material 124 in the source/drain regions of the transistor devices are exposed. At the conclusion of the etching process(es), the patterned layer of sacrificial material 138 including substantially all of the sacrificial material 138 in the well contact opening 134 may be removed so as to expose the well region 110. At this point, the well contact opening 134 is fully re-established, e.g., at least a portion of the bottom surface 134A is exposed.

Figure 18:
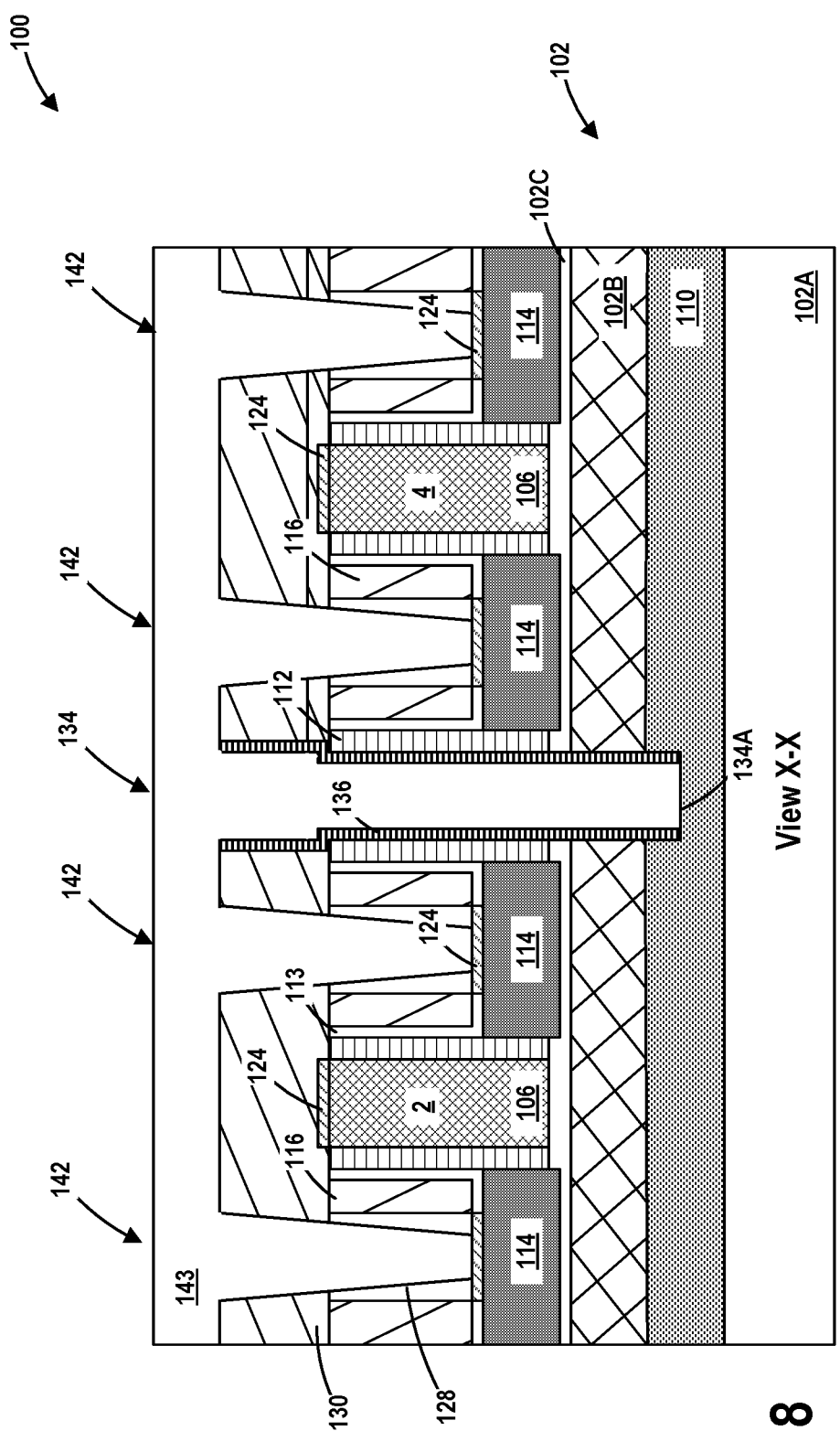
Figure 19:
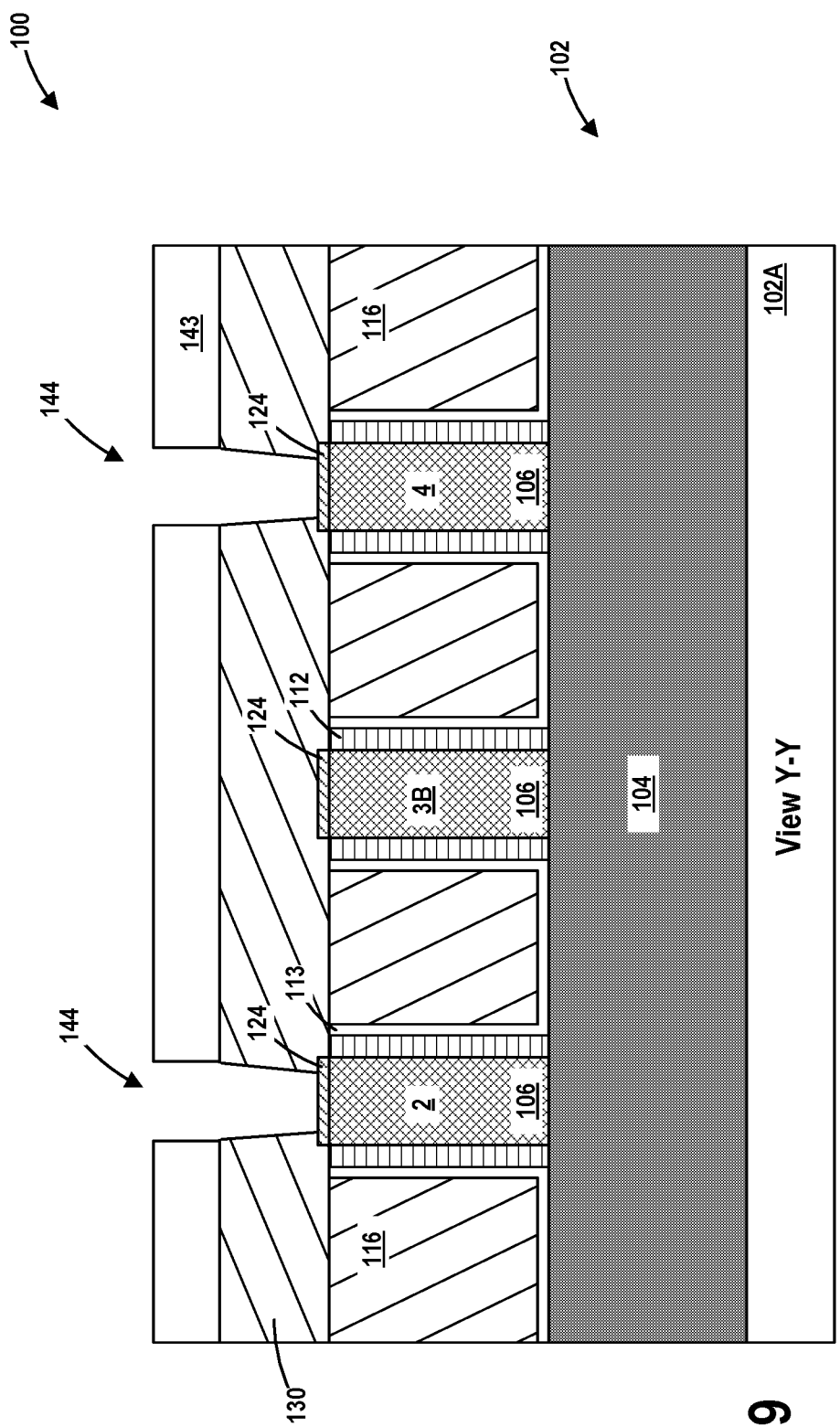

FIGS. 18 (view X-X) and 19 (view Y-Y) depict removing the patterned layer of sacrificial material 138. Next, a patterned etch mask 143, e.g., a patterned layer of photoresist, was formed above the layer(s) of insulating material 130. The patterned etch mask 143 includes a plurality of openings that corresponds to locations where the contact openings 144 for the gate contact structures 148 will be formed. The patterned etch mask 143 covers the location where the contact openings 142 and the well contact opening 134 were formed or re-established (see FIG. 18). Then, as shown in FIG. 19, one or more etching processes was performed through the patterned etch mask 143 to form the openings 144 in the layer(s) of insulating material 130 for the gate contact structures 148. At the conclusion of the etching process(es), portions of the metal silicide material 124 positioned on the gate structure 106 the transistor devices are exposed. At that point, the patterned etch mask 143 may be removed.

Figure 20:
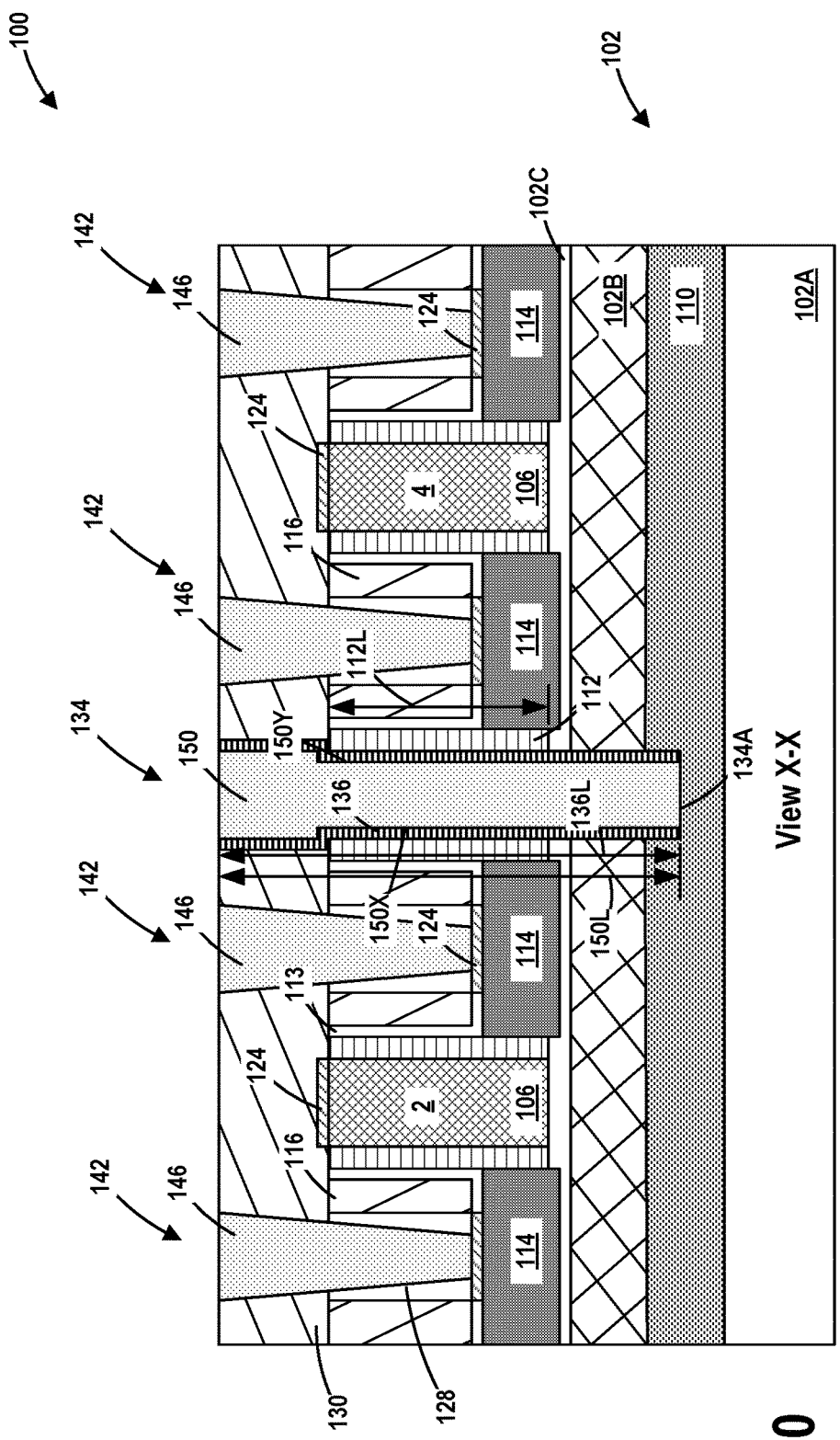
Figure 21:
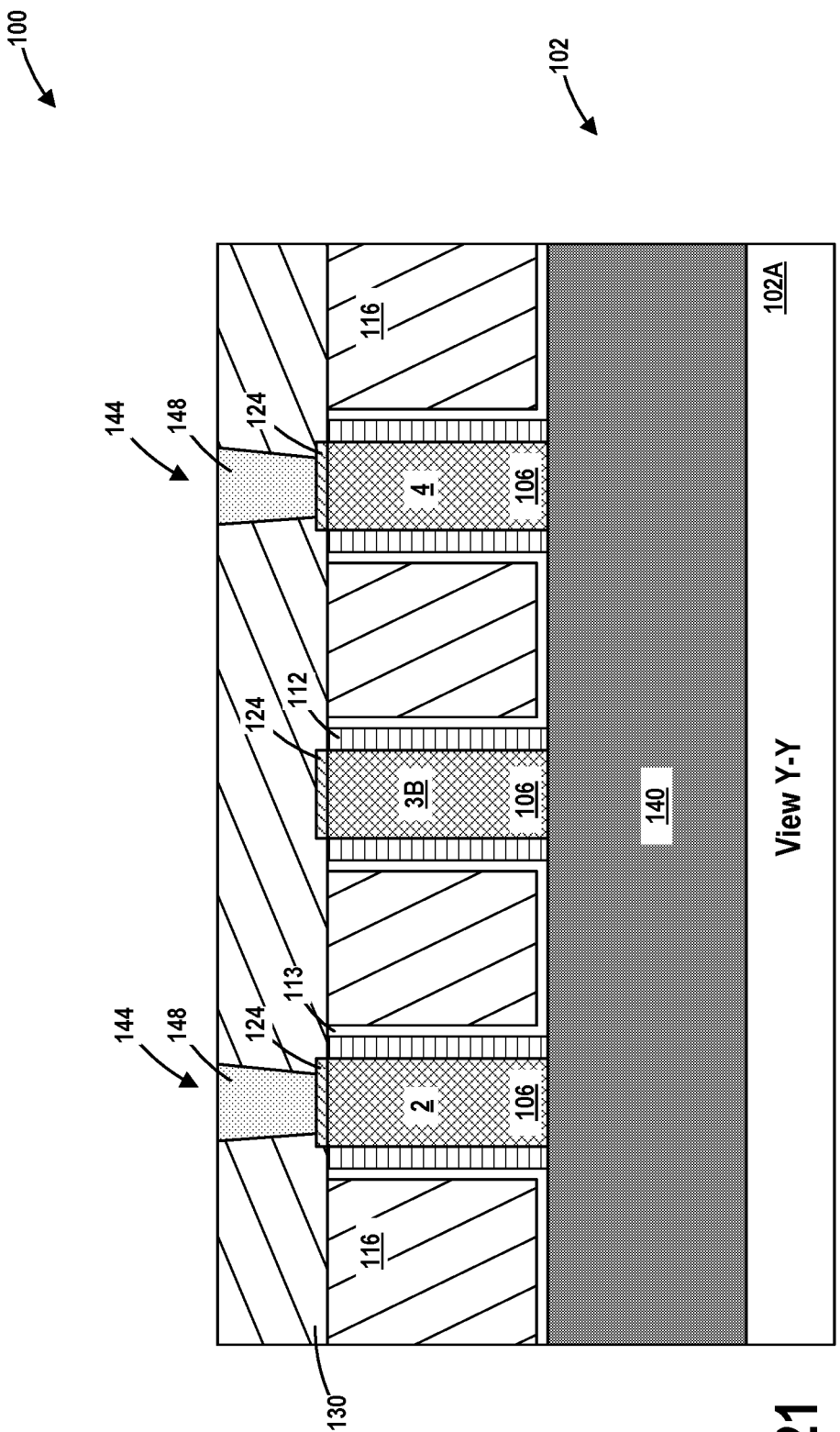

FIGS. 20 (view X-X), 21 (view Y-Y) and 22 (plan view) depict forming the source/drain contact structures 146, the gate contact structures 148 and the conductive well tap 150. Several of the layers of material and structures depicted in the cross-sectional views (FIGS. 20 and 21) are not depicted in FIG. 22 so as not to overly complicate the drawing. Note that, in this particular example, the source/drain contact structures 146, the gate contact structures 148, and the conductive well tap 150 are all formed at the same time and they all comprise the same materials, but that may not be the case in all applications, e.g., the conductive well tap 150 may be made of a material that is different from either the source/drain contact structures 146 or the gate contact structures 148. The source/drain contact structures 146, the gate contact structures 148, and the conductive well tap 150 may be comprised of a variety of different materials and they may be formed by performing various manufacturing techniques. In one illustrative example, one or more conformal barrier layers and/or seed layers (not separately shown) were formed so as to line the various openings with the barrier material(s). Next, one or more conductive materials (e.g., copper, a metal-containing material, a metal compound, tungsten, etc.) was then formed on the IC product 100 so as to overfill the various openings 142, 144 and the well contact opening 134. Here, a CMP process removes excess portions of the conductive materials from above the upper surface of the layer(s) of insulating material 130. These process operations result in the formation of the source/drain contact structures 146, the gate contact structures 148 and the conductive well tap 150. In this example, the gate contact structures 148 are positioned above the STI region 104. However, in some process flows, the gate contact structures 148 may be positioned (wholly or partially) above the active region 103. Each of the source/drain contact structures 146 conductively contacts an underlying region of metal silicide material 124 in the source/drain regions of the devices.

Figure 27:
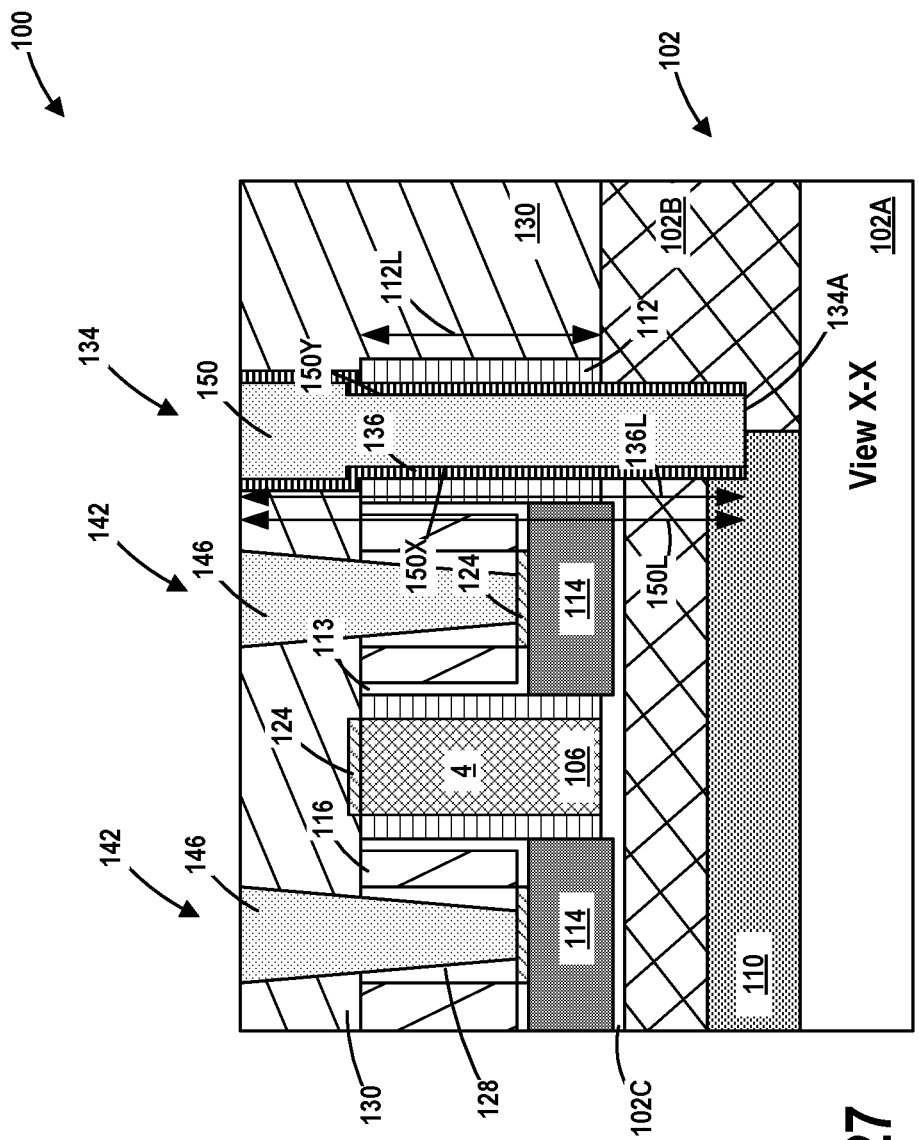

Note that in the depicted example, the conductive well tap 150 was formed in approximately the middle (in the left-right direction) of the active region 103, by removing portions of the axial length of the gate structure 106 of gate 3. However, as will be appreciated by those skilled in the art after a complete reading of the present application, the conductive well tap 150 could be formed at any location so long as it conductively contacts the doped well region 110. For example, in some applications, and with reference to FIGS. 1 and 27, "dummy" gate structures may be formed above the opposite ends 103A, 103B of an active region 103 while one or more "active" gate structures are formed above the active region 103 between the two dummy gate structures. Typically, and as shown in the example of FIG. 27, only about half of the width of the dummy gate structure (in the gate length direction of the transistor devices) is positioned above the active region while the other half of the dummy gate structure is positioned above isolation material. Portions of such a dummy gate structure could be removed as described above and the conductive well tap 150 could be formed at the location where the dummy gate structure was removed, whereby the conductive well tap 150 would physically contact the edge of the active region as seen in the example of FIG. 27. In the particular example of FIG. 27, gate 5 of FIG. 1 has been used as a dummy gate to form well tap 150 in accordance with the formation of a well tap 150 in gate 3 as described above. While FIG. 27 shows well tap 150 adjacent a transistor, it should be readily apparent to those skilled in the art that well tap 150 could be adjacent any other suitable device.

Figure 22:
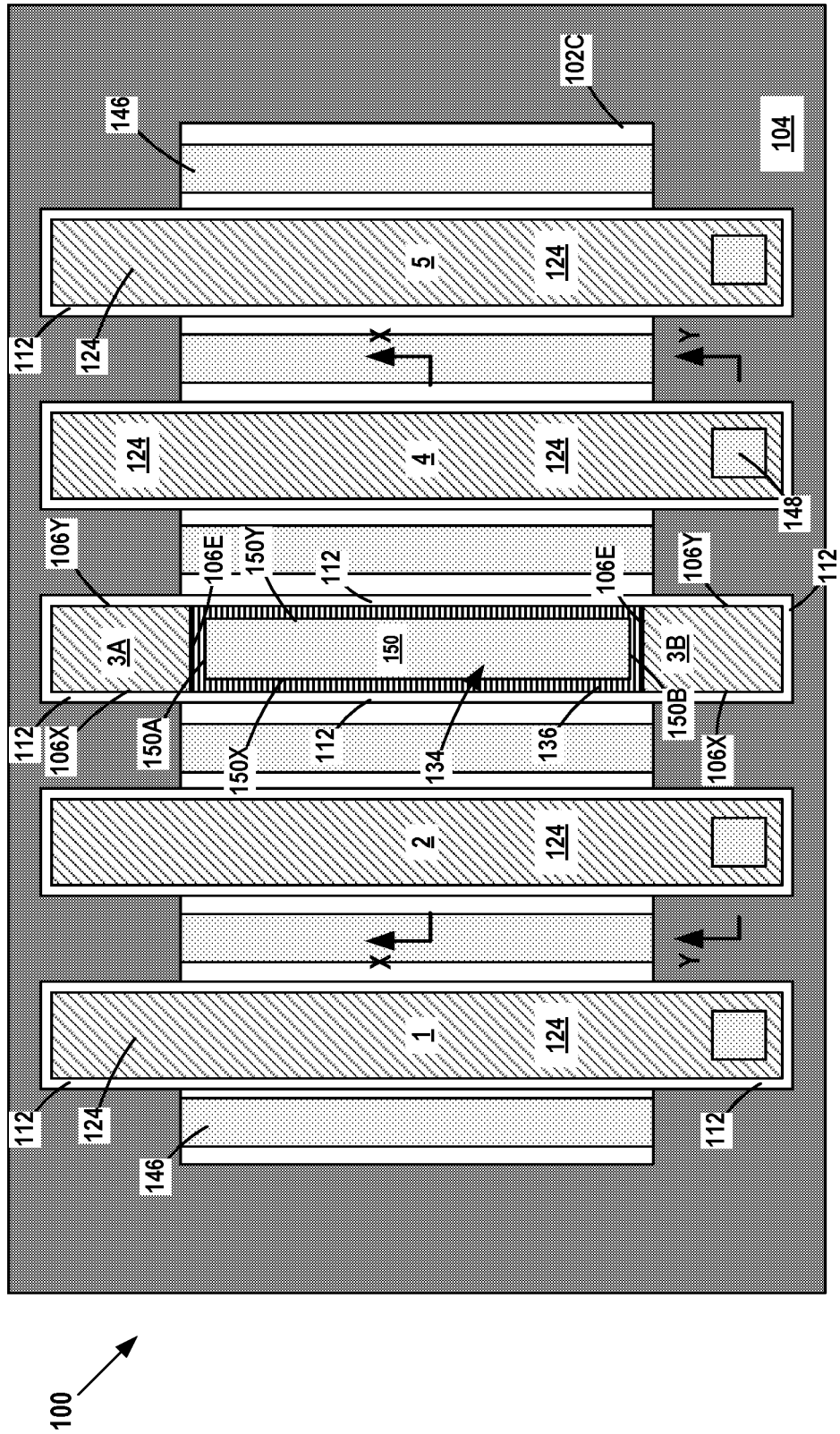

As will be appreciated by those skilled in the art after a complete reading of the present application, there are several aspects to the IC product 100 disclosed herein. The conductive well tap 150 was formed in a self-aligned manner in the well contact opening 134. With reference to FIG. 22, and in one illustrative embodiment, the sidewall spacer 136 is positioned around the outer perimeter of the conductive well tap 150 for substantially the entire vertical height 150L (see FIG. 20) of the conductive well tap 150. Referring again to FIG. 20, the sidewall spacer 136 has a vertical height 136L, i.e., that is greater than the vertical height 112L of the sidewall spacer 112. With reference to FIGS. 20 and 22, the conductive well tap 150 has first 150X and second 150Y opposing vertical sidewall surfaces that extend in the gate width direction of the transistor devices and first 150A and second 150B opposing end surfaces that extend in the gate length direction of the transistor devices. The first 150X and second 150Y opposing vertical sidewall surfaces and first 150A and second 150B opposing end surfaces of the conductive well tap 150 collectively defined the outer perimeter of the conductive well tap 150. In one illustrative example, the sidewall spacer 136 is positioned around the entire outer perimeter of the conductive well tap 150 and the sidewall spacer 112 is positioned adjacent the sidewall spacer 136 along the opposing sides surfaces 150X, 150Y of the conductive well tap 150. In one particular embodiment, the sidewall spacer 136 is positioned on and in physical contact with the entire outer perimeter (i.e., the opposing sidewall surfaces 150X, 150Y and the opposing end surfaces 150A, 150B) of the conductive well tap 150 for substantially the entire vertical height of the conductive well tap 150, while the sidewall spacer 112 is positioned on and in physical contact with the sidewall spacer 136.

Also note that, in this particular embodiment, the sidewall spacer 112, is not positioned around the entire outer perimeter of the conductive well tap 150, it is only positioned adjacent the opposing sidewall surfaces 150X and 150Y of the conductive well tap 150. In addition to being positioned adjacent the opposing sidewalls 150X, 150Y of the conductive well tap 150, the sidewall spacer 112 is positioned adjacent the opposing lateral sidewalls 106X, 106Y of the gate structures 106 of both of the gates 3A and 3B. In the example depicted herein, the conductive well tap 150 is separated from the gate structures 106 of the gates 3A and 3B by at least the sidewall spacer 136, i.e., a first portion of the sidewall spacer 136 is positioned between the end surface 106E of the gate structure 106 of gate 3A the and end surface 150A of the conductive well tap 150 while a first second portion of the sidewall spacer 136 is positioned between the end surface 106E of the gate structure 106 of gate 3B the and end surface 150B of the conductive well tap 1503B. In one illustrative embodiment, the sidewall spacer 136 physically contacts the end surface 106E of the gate structure 106 of the gates 3A and 3B. Also note that, when viewed from above, the conductive well tap 150 is positioned between the end surfaces 106E of the gate structures 106 of the gates 3A and 3B.

Figure 23:
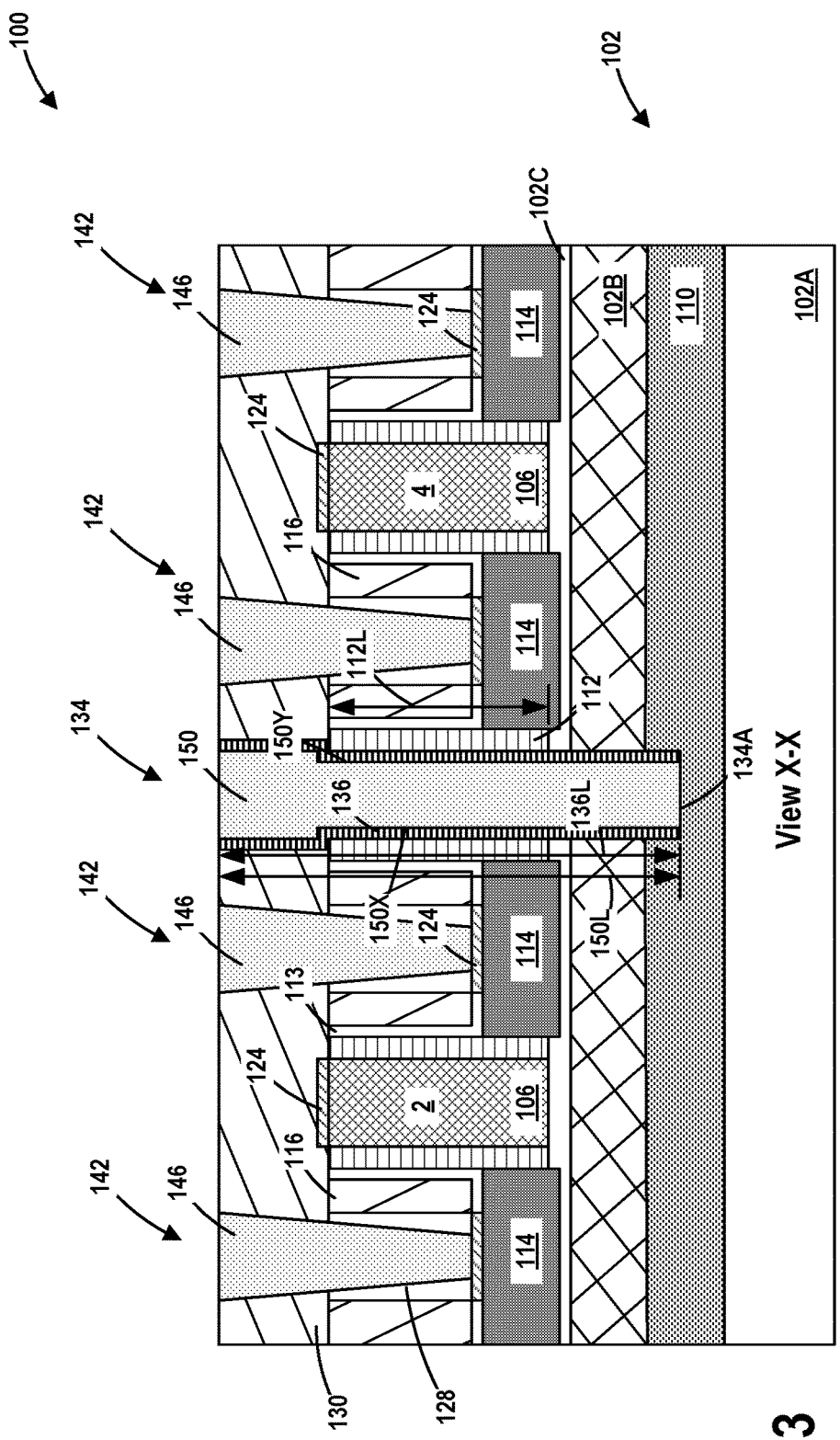
Figure 24:
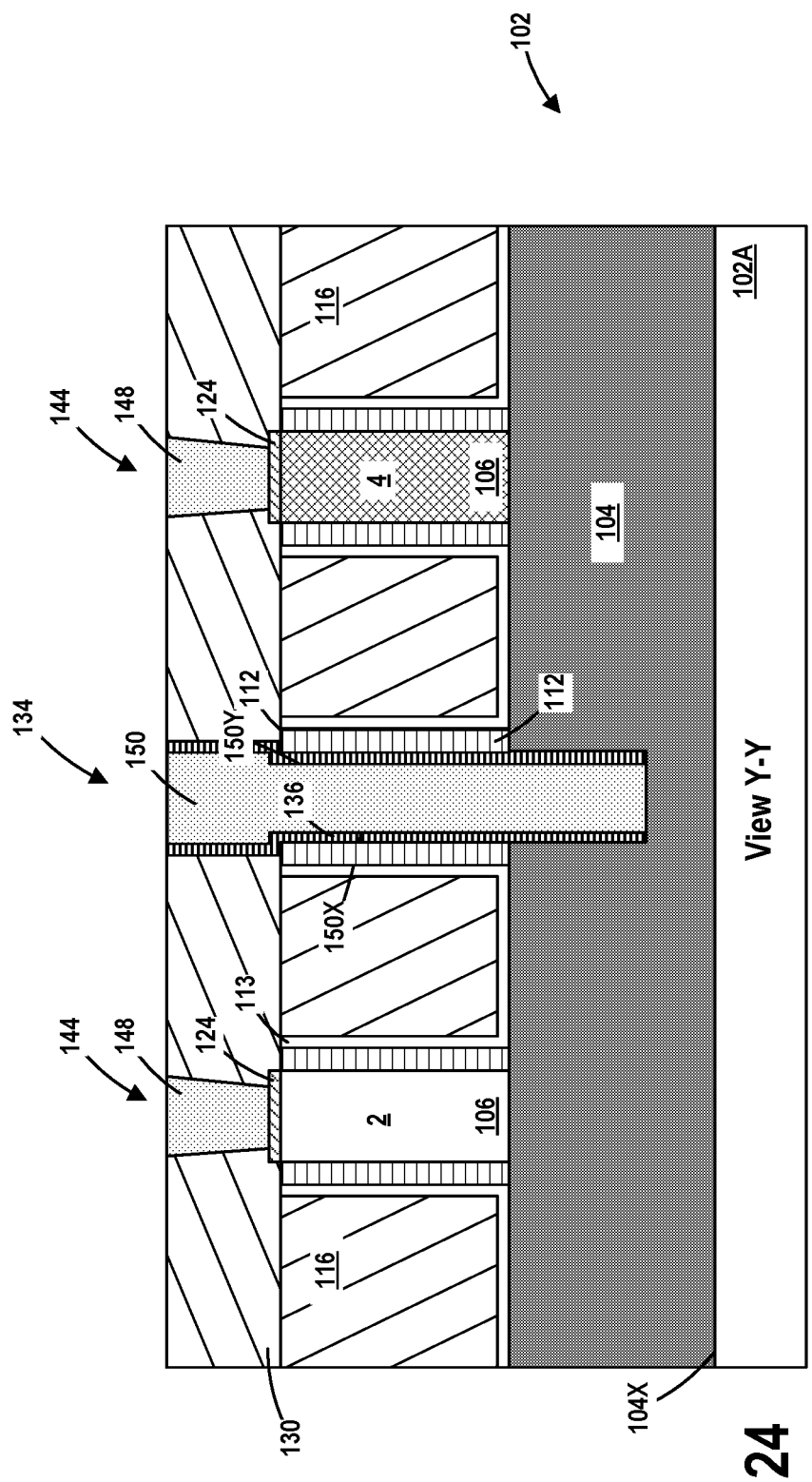
Figure 25:
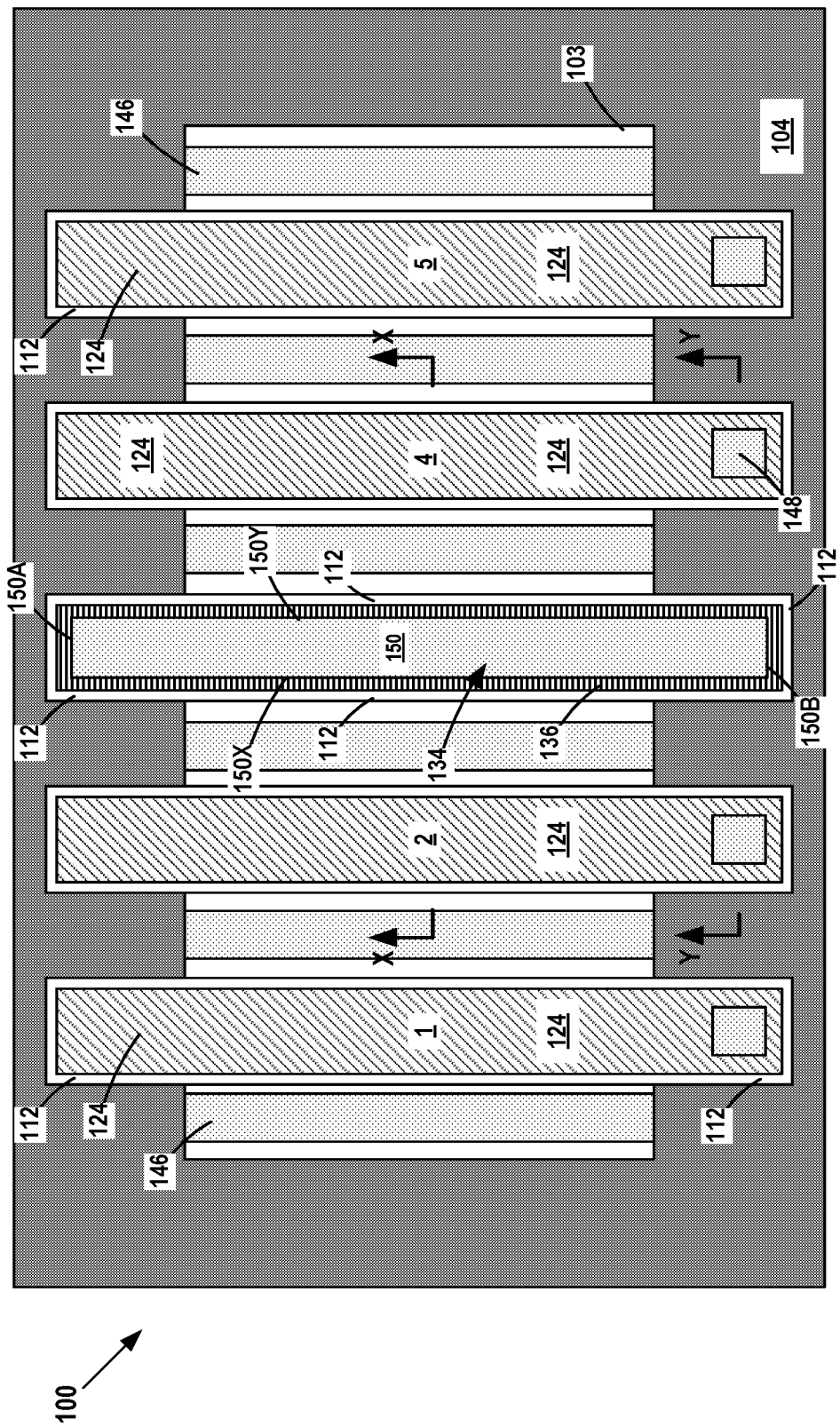

As noted above, the axial length of the conductive well tap 150 (in the gate width direction of the transistor devices) may vary depending upon the particular application. Forming the axial length of the conductive well tap 150 greater may make it easier to contact the conductive well tap 150 with a conductive via in one of the metallization layers (not shown) that will be formed on the IC product 100. FIGS. 23, (view X-X), 24 (view Y-Y) and 25 (plan view) depict an embodiment where the axial length of the conductive well tap 150 is substantially equal to the original length of the gate structure 106 of gate 3. Note that, in this example, the conductive well tap 150 extends (in the gate width direction of the transistor devices) across the entirety of the active region 103, and portions of the conductive well tap 150 are positioned above the STI region 104 on opposite sides of the active region 104. Since the bottom surface 104X (see FIG. 24) of the STI region 104 is positioned at a level that is below the bottom surface of the buried insulation layer 102B, the portions of the conductive well tap 150 that are positioned above the STI region 104 actually stop within the STI region 104.

Figure 26:
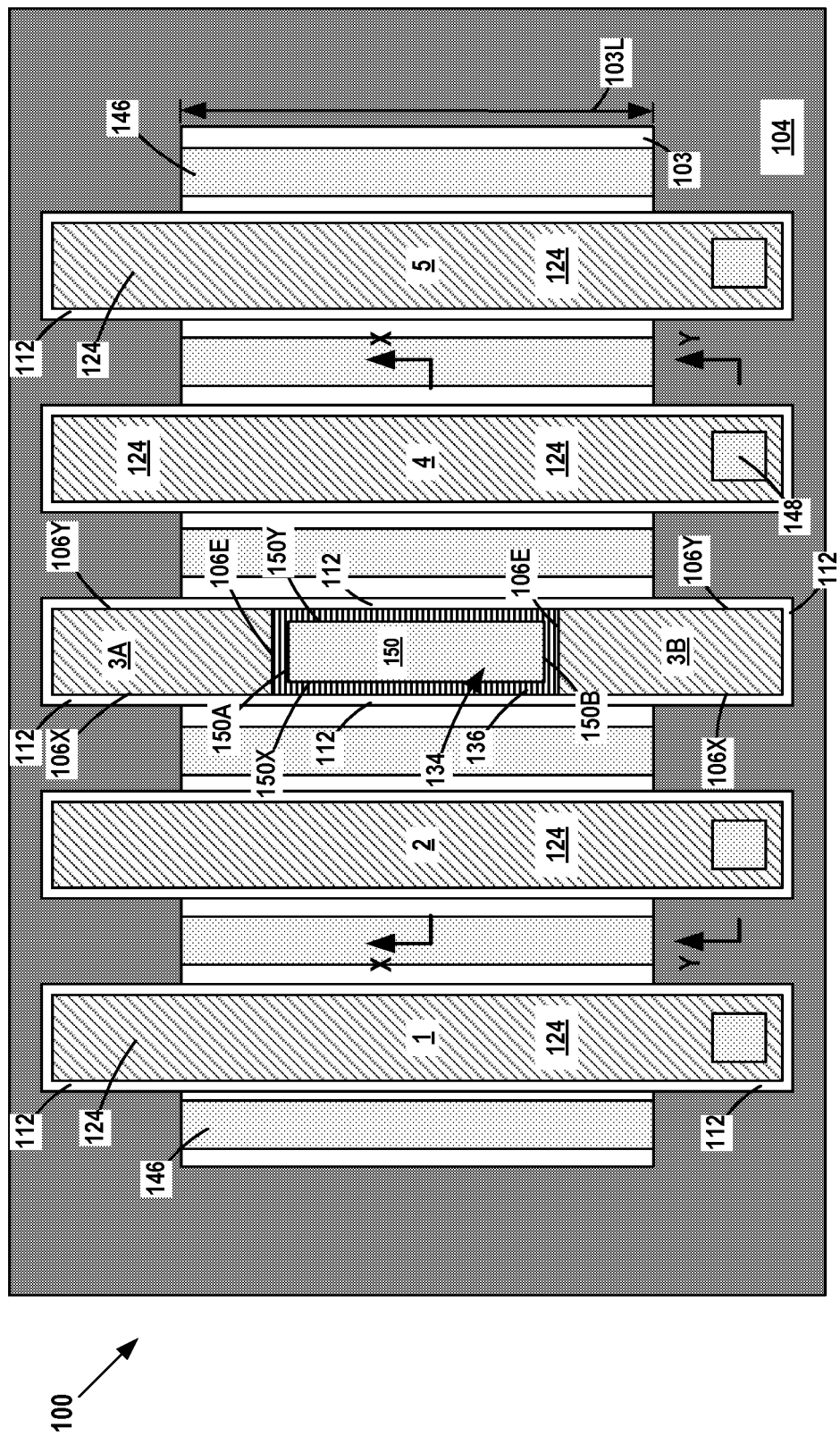

FIG. 26 (plan view) depicts an example wherein the axial length of the conductive well tap 150 (in the gate width direction of the transistor devices) of the conductive well tap 150 is substantially less than the axial length 103L (in the gate width direction) of the active region 103. The cross-sectional views for this example would be the same as those shown in FIGS. 20 and 21.

Figure 28:
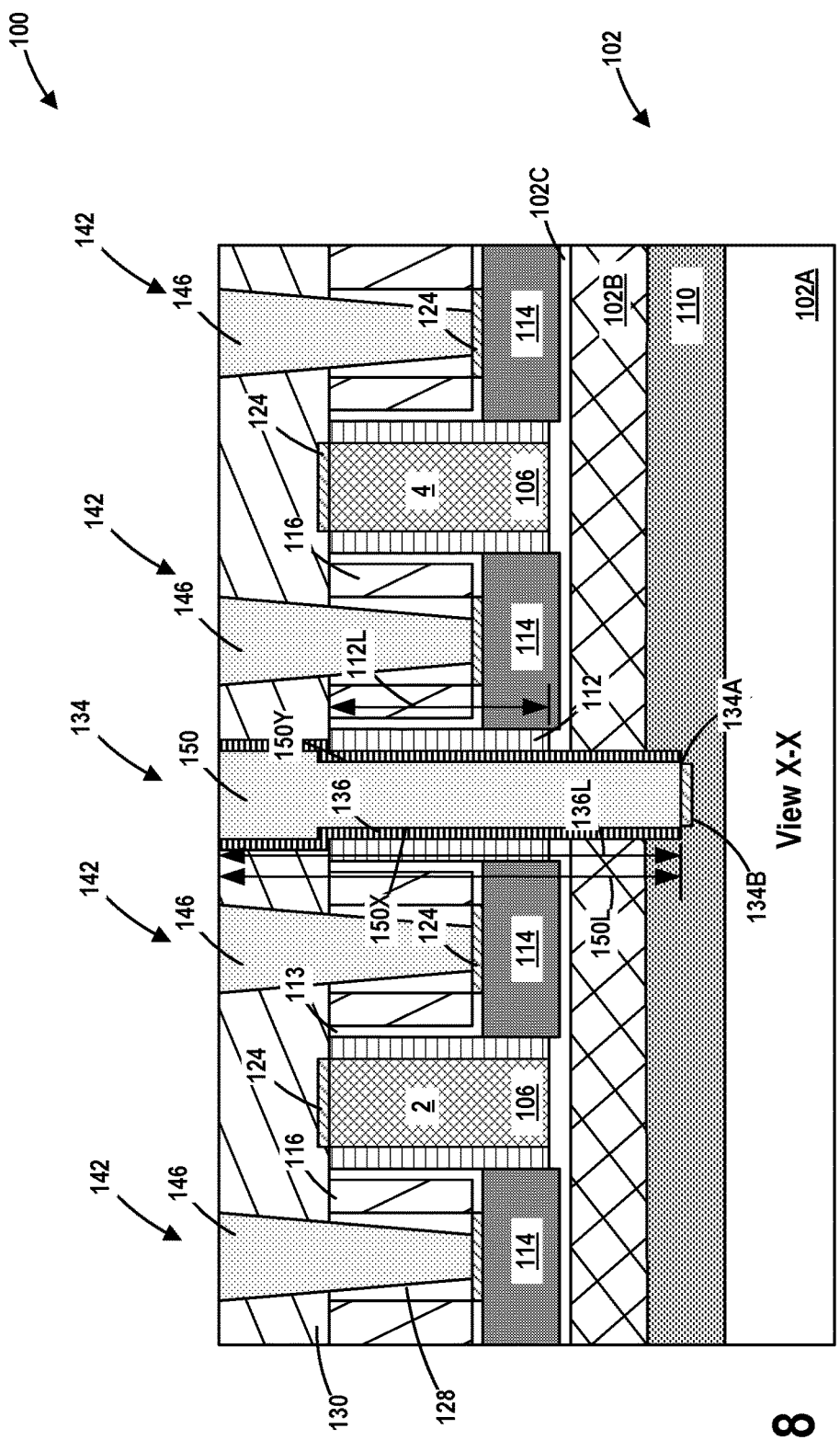

It should be noted that while the structure described herein is referred to as a well tap and is illustrated in the context of transistors, well tap 150 can also be used with and/or to form a diode. For example, FIG. 28 illustrates an embodiment in which gate 3 of FIG. 1 has been used as a "dummy" gate to form a structure very much the same as well tap 150, but prior to deposit of the conductive material as described with relation to FIGS. 20 and 21, a diode well 134B can be formed on or below bottom surface 134A of opening 134, when bottom surface 134A is an exposed surface of doped well region 110. Diode well 134B is of opposite type from that of doped well region 110, so that if doped well region 110 were an N-well, then diode well 134B would be a P-well, while if doped well region 110 were a P-well, then diode well 134B would be an N-well. By connecting out the diode well 134B, well tap 150's structure can then operate as a diode. It should be clear to those skilled in the art what steps could be employed to form diode well 134B and to connect out diode well 134B, particularly in light of the description of embodiments above, and so such steps are not described with regard to this particular embodiment.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is there-fore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A device, comprising:
   a doped well region;
   a well tap that is coupled to the doped well region, the well tap comprising first and second opposing sidewall surfaces;
   a first sidewall spacer positioned around the well tap, the first sidewall spacer having a first vertical height; and
   a second sidewall spacer positioned adjacent the first sidewall spacer along the first and second opposing sidewall surfaces of the well tap, the second sidewall spacer having a second vertical height that is less than the first vertical height.

2. The device of claim 1, wherein the second sidewall spacer does not surround the well tap.

3. The device of claim 1, wherein the first sidewall spacer is positioned on and in physical contact with the well tap and the second sidewall spacer is positioned on and in physical contact with the first sidewall spacer.

4. The device of claim 1, wherein the well tap comprises at least one material that has a third vertical height and wherein the first vertical height of the first sidewall spacer is substantially equal to the third vertical height.

5. The device of claim 1, further comprising a semiconductor-on-insulator (SOI) substrate, the SOI substrate comprising a base semiconductor layer, a buried insulation layer positioned on the base semiconductor layer, and an active semiconductor layer positioned on the buried insulation layer, wherein the doped well region is at least partially positioned in the base semiconductor layer, and wherein the well tap extends through the buried insulation layer and into the base semiconductor layer.

6. The device of claim 1, further comprising:
a transistor, the transistor comprising a gate structure, a source region, and a drain region;
a gate contact structure that is coupled to the gate structure; and
a source/drain contact structure that is coupled to one of the source region and the drain region, wherein the well tap, the gate contact structure, and the source/drain contact structure all comprise a same materials of construction.

7. The device of claim 1, further comprising a gate structure, the gate structure comprising opposing lateral sidewalls, wherein the second sidewall spacer is positioned adjacent the opposing lateral sidewalls of the gate structure.

8. The device of claim 1, further comprising:
a first gate structure, the first gate structure comprising a first end surface; and
a second gate structure, the second gate structure comprising a second end surface, wherein the well tap is positioned between the first end surface and the second end surface.

9. The device of claim 8, wherein the first gate structure comprises a first pair of opposing lateral sidewalls, wherein the second gate structure comprises a second pair of opposing lateral sidewalls, and wherein the second sidewall spacer is positioned adjacent the first pair of opposing lateral sidewalls of the first gate structure and adjacent the second pair of opposing lateral sidewalls of the second gate structure.

10. The device of claim 1, further comprising:
an active region; and
a transistor on the active region, the transistor comprising a gate structure, a source region, and a drain region, the transistor having a gate width that extends in a gate width direction, and the active region having a first dimension in the gate width direction, wherein the well tap has a second dimension in the gate width direction that is no larger than the first dimension.

11. The device of claim 1, further comprising:
a diode well formed between the well tap and the doped well region, the diode well being of opposite type from that of the doped well region.

12. The device of claim 1, further comprising:
an active region;
an isolation structure positioned around the active region;
a doped well region positioned in a semiconductor material below the active region wherein the well tap comprises a first portion that contacts the doped well region and a second portion that is positioned above the isolation structure.

13. The device of claim 12, wherein the well tap comprises a third portion that is positioned above the isolation structure, wherein, when viewed from above, the first portion of the well tap is positioned between the second and third portions of the well tap.

* * * * *